US011462522B2

(12) United States Patent
Mun et al.

(10) Patent No.: US 11,462,522 B2
(45) Date of Patent: Oct. 4, 2022

(54) DISPLAY MODULE AND DISPLAY DEVICE INCLUDING INORGANIC LIGHT EMITTING ELEMENT AND LIGHT BLOCKING MEMBER ON CONNECTING MEMBER

(71) Applicant: SAMSUNG ELECTRONICS CO., LTD., Suwon-si (KR)

(72) Inventors: Ilju Mun, Suwon-si (KR); Seungryong Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 97 days.

(21) Appl. No.: 16/589,459

(22) Filed: Oct. 1, 2019

(65) Prior Publication Data
US 2020/0161283 A1    May 21, 2020

(30) Foreign Application Priority Data
Nov. 15, 2018   (KR) .................. 10-2018-0140918

(51) Int. Cl.
*H01L 25/16* (2006.01)
*H01L 27/12* (2006.01)
(Continued)

(52) U.S. Cl.
CPC ........ *H01L 25/167* (2013.01); *H01L 27/1214* (2013.01); *H01L 33/387* (2013.01); *H01L 33/62* (2013.01); *G02F 1/136209* (2013.01)

(58) Field of Classification Search
CPC . H01L 25/167; H01L 27/1214; H01L 33/387; H01L 33/62; G02F 1/136209
See application file for complete search history.

(56) References Cited

U.S. PATENT DOCUMENTS 6,964,877 B2   11/2005   Chen et al.
7,654,878 B2    2/2010   Morley et al.
(Continued)

FOREIGN PATENT DOCUMENTS

| EP | 3 174 109 A1 | 5/2017 |
|----|---|---|
| JP | 2015-023221 A | 2/2015 |
| WO | 2018/082101 A1 | 5/2018 |

OTHER PUBLICATIONS

International Search Report and Written Opinion dated Feb. 5, 2020 in International Application No. PCT/KR2019/012727.
(Continued)

*Primary Examiner* — Peter Bradford
(74) *Attorney, Agent, or Firm* — Nixon & Vanderhye P.C.

(57) ABSTRACT

Disclosed is a display module that includes a substrate including a plurality of interconnection wires, a connecting member comprising a conductive material disposed on one side of the substrate, a plurality of inorganic light emitting elements comprising light emitting circuitry arranged on the connecting member, and a light blocking member comprising an opaque material disposed on a region other than regions where the plurality of inorganic light emitting elements are disposed. A portion of each of the plurality of inorganic light emitting elements is disposed to pass through a portion of the connecting member and is spaced apart from the substrate. The connecting member electrically connects each of the plurality of inorganic light emitting elements with at least one interconnection wire among the plurality of interconnection wires. The light blocking member is spaced apart from the substrate and disposed on the connecting member.

20 Claims, 20 Drawing Sheets

(51) Int. Cl.
*H01L 33/38* (2010.01)
*H01L 33/62* (2010.01)
*G02F 1/1362* (2006.01)

(56) References Cited

U.S. PATENT DOCUMENTS

| | | | |
|---|---|---|---|
| 8,933,433 B2 | 1/2015 | Higginson et al. |
| 9,263,627 B2 | 2/2016 | Higginson et al. |
| 9,589,944 B2 | 3/2017 | Higginson et al. |
| 9,818,725 B2 | 11/2017 | Bower et al. |
| 9,825,067 B2 | 11/2017 | Rhee |
| 9,911,722 B2 | 3/2018 | Higginson et al. |
| 10,192,858 B2 | 1/2019 | Higginson et al. |
| 10,304,813 B2 | 5/2019 | Kuo et al. |
| 10,446,724 B2 | 10/2019 | Kwon et al. |
| 10,461,065 B2 | 10/2019 | Ozeki et al. |
| 2002/0163301 A1 | 11/2002 | Morley et al. |
| 2004/0188696 A1 | 9/2004 | Hsing Chen et al. |
| 2004/0203189 A1 | 10/2004 | Chen et al. |
| 2005/0020175 A1 | 1/2005 | Tamashiro et al. |
| 2014/0027709 A1 | 1/2014 | Higginson et al. |
| 2014/0291709 A1 | 10/2014 | Tomoda et al. |
| 2015/0093842 A1 | 4/2015 | Higginson et al. |
| 2016/0148916 A1 | 5/2016 | Higginson et al. |
| 2016/0351539 A1 | 12/2016 | Bower et al. |
| 2017/0012026 A1* | 1/2017 | Choi ................ H01L 33/60 |
| 2017/0062674 A1 | 3/2017 | Kwon et al. |
| 2017/0125391 A1 | 5/2017 | Higginson et al. |
| 2017/0133357 A1 | 5/2017 | Kuo et al. |
| 2017/0154880 A1* | 6/2017 | Ozeki ................ H01L 24/73 |
| 2017/0207249 A1 | 7/2017 | Rhee |
| 2018/0076182 A1* | 3/2018 | Wu et al. ............ H01L 25/0753 |
| 2018/0197844 A1 | 7/2018 | Higginson et al. |
| 2019/0123032 A1 | 4/2019 | Higginson et al. |
| 2019/0131282 A1* | 5/2019 | Liu ................ H01L 24/81 |
| 2019/0198463 A1* | 6/2019 | Kariyazaki ....... H01L 23/49827 |
| 2019/0334060 A1 | 10/2019 | Zou et al. |
| 2020/0303608 A1* | 9/2020 | Song ................ H05K 3/403 |

OTHER PUBLICATIONS

European Extended Search Report dated Aug. 6, 2021 for EP Application No. 19885671.8.

* cited by examiner

DISPLAY MODULE AND DISPLAY DEVICE INCLUDING INORGANIC LIGHT EMITTING ELEMENT AND LIGHT BLOCKING MEMBER ON CONNECTING MEMBER

CROSS-REFERENCE TO RELATED APPLICATION

This application is based on and claims priority under 35 U.S.C. § 119 to Korean Patent Application No. 10-2018-0140918, filed on Nov. 15, 2018, in the Korean Intellectual Property Office, the disclosure of which is incorporated by reference herein its entirety.

BACKGROUND

1. Field

The disclosure relates to a technology for disposing an inorganic light emitting element and a light blocking member on a connecting member to improve the contrast ratio (CR) of a display.

2. Description of Related Art

A display module including a display device may display a screen in various ways. A display device, such as a liquid crystal display (LCD) device or a light emitting diode (LED) chip, which includes a back light has a thin film transistor (TFT) substrate and a color filter substrate that are sequentially disposed on the back light, in which the color filter substrate imparts colors to light emitted from the back light. A light blocking member such as a black matrix (BM) for preventing the mixture of light passing through color filters of different colors is disposed between the color filters. The light blocking member is disposed on a region through which light does not pass.

Recently, a display module having micro light emitting diodes (μLEDs) applied thereto has emerged. The display module having the μLEDs applied thereto includes micrometer-scale inorganic light emitting elements having an area less than about 0.01 times to about 0.1 times the areas of LED chips. The inorganic light emitting elements are at least partly exposed on an upper side of a TFT substrate and emit light of their own colors.

In the case of the display module having the color filters, the luminance of a screen displayed may be decreased. Furthermore, in the case of the display module having the light blocking member disposed between the color filters, the viewing angle may be reduced, and therefore the display quality of the display module may be degraded when the display module is viewed from a side.

In the case of the display module having the inorganic light emitting elements at least partly exposed on the upper side of the TFT substrate, a connecting member may be disposed to fix the inorganic light emitting elements. In this case, the performance of displaying a black gradation may be degraded due to the color of the connecting member. Furthermore, the display quality of the display module may be degraded due to diffused reflection caused by a non-uniform rough surface of the connecting member.

The above information is presented as background information only to assist with an understanding of the disclosure. No determination has been made, and no assertion is made, as to whether any of the above might be applicable as prior art with regard to the disclosure.

SUMMARY

Embodiments of the disclosure address at least the above-mentioned problems and/or disadvantages and provide at least the advantages described below. Accordingly, an example aspect of the disclosure is to provide a display module and a display device that have a light blocking member for improving the contrast ratio of an inorganic light emitting element without reducing a viewing angle and without invading an emissive area of the inorganic light emitting element.

In accordance with an example aspect of the disclosure, a display module includes a substrate including a plurality of interconnection wires, a connecting member comprising a conductive material disposed on one side of the substrate, a plurality of inorganic light emitting elements arranged on the connecting member, and a light blocking member comprising an opaque material disposed on a region other than regions where the plurality of inorganic light emitting elements are disposed. A portion of each of the plurality of inorganic light emitting elements is disposed to pass through a portion of the connecting member and is spaced apart from the substrate. The connecting member electrically connects each of the plurality of inorganic light emitting elements with at least one interconnection wire among the plurality of interconnection wires. The light blocking member is spaced apart from the substrate and disposed on the connecting member.

In accordance with another example aspect of the disclosure, a display device includes one or more display modules and a connecting portion including a region joining the one or more display modules. Each of the one or more display modules includes a substrate including a plurality of interconnection wires, a connecting member comprising a conductive material disposed on one side of the substrate, a plurality of inorganic light emitting elements arranged on the connecting member, and a light blocking member comprising an opaque material disposed on a region other than regions where the plurality of inorganic light emitting elements are disposed. A portion of each of the plurality of inorganic light emitting elements is disposed to pass through a portion of the connecting member and is spaced apart from the substrate. The connecting member electrically connects each of the plurality of inorganic light emitting elements with at least one interconnection wire among the plurality of interconnection wires. The light blocking member is spaced apart from the substrate and disposed on the connecting portion and the connecting member.

In accordance with another example aspect of the disclosure, a display module includes a substrate, a connecting member comprising a conductive material disposed on an upper side of the substrate, a plurality of inorganic light emitting elements, each of which is disposed to pass through at least a portion of the connecting member and is fixed in a specified position, and a black matrix (BM) spaced apart from the plurality of inorganic light emitting elements. The plurality of inorganic light emitting elements are spaced apart from the substrate. The connecting member electrically connects the plurality of inorganic light emitting elements with a plurality of electrodes or a plurality of pads disposed on the substrate. The BM is spaced apart from the substrate and disposed on the connecting member.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following detailed description taken in conjunction with the accompanying drawings, in which.

With regard to the description of the drawings, identical or similar reference numerals may be used to refer to identical or similar components.

DETAILED DESCRIPTION

Hereinafter, various example embodiments of the disclosure will be described with reference to the accompanying drawings. However, those of ordinary skill in the art will recognize that various modifications, equivalents, and/or alternatives on the various example embodiments described herein can be variously made without departing from the scope and spirit of the disclosure.

Figure 1:
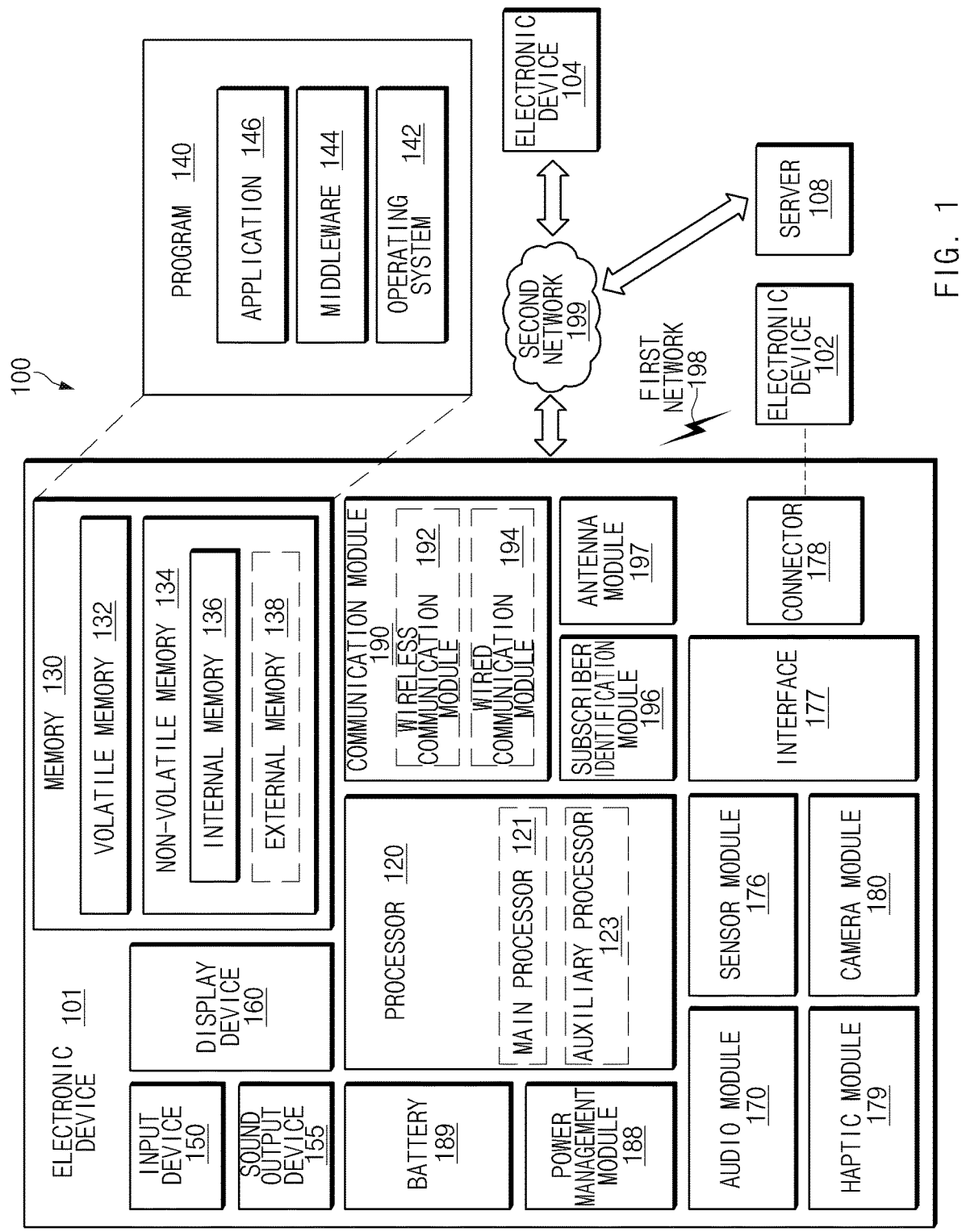
FIG. 1 is a block diagram illustrating an example electronic device in a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, a memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an example embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 890) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 840 may be stored in the memory 130 as software, and may include, for example, an operating system (OS) 842, middleware 844, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an example embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 897 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
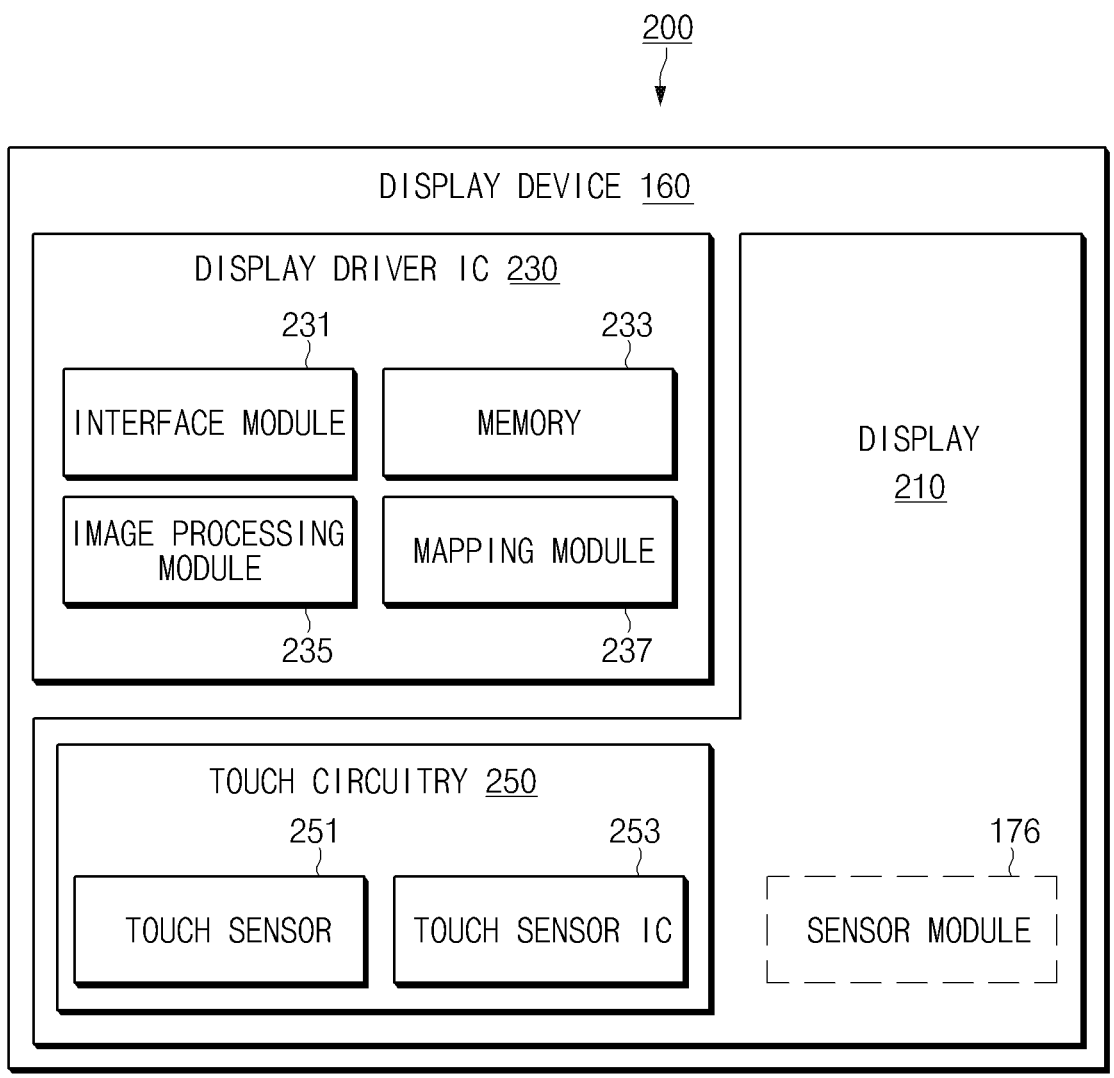
FIG. 2 is a block diagram illustrating an example display device according to various embodiments.

FIG. 2 is a block diagram 200 illustrating an example display device 160 according to various embodiments. Referring to FIG. 2, the display device 160 may include a display 210 and a display driver integrated circuit (DDI) 230 to control the display 210. The DDI 230 may include an interface module 231, memory 233 (e.g., buffer memory), an image processing module 235, or a mapping module 237. The DDI 230 may receive image information that contains image data or an image control signal corresponding to a command to control the image data from another component of the electronic device 101 via the interface module 231. For example, according to an embodiment, the image information may be received from the processor 120 (e.g., the main processor 121 (e.g., an application processor)) or the auxiliary processor 123 (e.g., a graphics processing unit) operated independently from the function of the main processor 121. The DDI 230 may communicate, for example, with touch circuitry 250 or the sensor module 176 via the interface module 231. The DDI 230 may also store at least part of the received image information in the memory 233, for example, on a frame by frame basis.

The image processing module 235 may perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 210.

The mapping module 237 may generate a voltage value or a current value corresponding to the image data pre-processed or post-processed by the image processing module 235. According to an embodiment, the generating of the voltage value or current value may be performed, for example, based at least in part on one or more attributes of the pixels (e.g., an array, such as an RGB stripe or a pentile structure, of the pixels, or the size of each sub-pixel). At least some pixels of the display 210 may be driven, for example, based at least in part on the voltage value or the current value such that visual information (e.g., a text, an image, or an icon) corresponding to the image data may be displayed via the display 210.

According to an embodiment, the display device 160 may further include the touch circuitry 250. The touch circuitry 250 may include a touch sensor 251 and a touch sensor IC 253 to control the touch sensor 951. The touch sensor IC 253 may control the touch sensor 251 to sense a touch input or a hovering input with respect to a certain position on the display 210. To achieve this, for example, the touch sensor 251 may detect (e.g., measure) a change in a signal (e.g., a voltage, a quantity of light, a resistance, or a quantity of one or more electric charges) corresponding to the certain position on the display 210. The touch circuitry 250 may provide input information (e.g., a position, an area, a pressure, or a time) indicative of the touch input or the hovering input detected via the touch sensor 251 to the processor 120. According to an embodiment, at least part (e.g., the touch sensor IC 253) of the touch circuitry 250 may be formed as part of the display 210 or the DDI 230, or as part of another component (e.g., the auxiliary processor 123) disposed outside the display device 160.

According to an embodiment, the display device 160 may further include at least one sensor (e.g., a fingerprint sensor, an iris sensor, a pressure sensor, or an illuminance sensor) of the sensor module 176 or a control circuit for the at least one sensor. In such a case, the at least one sensor or the control circuit for the at least one sensor may be embedded in one portion of a component (e.g., the display 210, the DDI 230, or the touch circuitry 250)) of the display device 160. For example, when the sensor module 176 embedded in the display device 160 includes a biometric sensor (e.g., a fingerprint sensor), the biometric sensor may obtain biometric information (e.g., a fingerprint image) corresponding to a touch input received via a portion of the display 210. As another example, when the sensor module 176 embedded in the display device 160 includes a pressure sensor, the pressure sensor may obtain pressure information corresponding to a touch input received via a partial or whole area of the display 210. According to an embodiment, the touch sensor 251 or the sensor module 176 may be disposed between pixels in a pixel layer of the display 210, or over or under the pixel layer.

Figure 3:
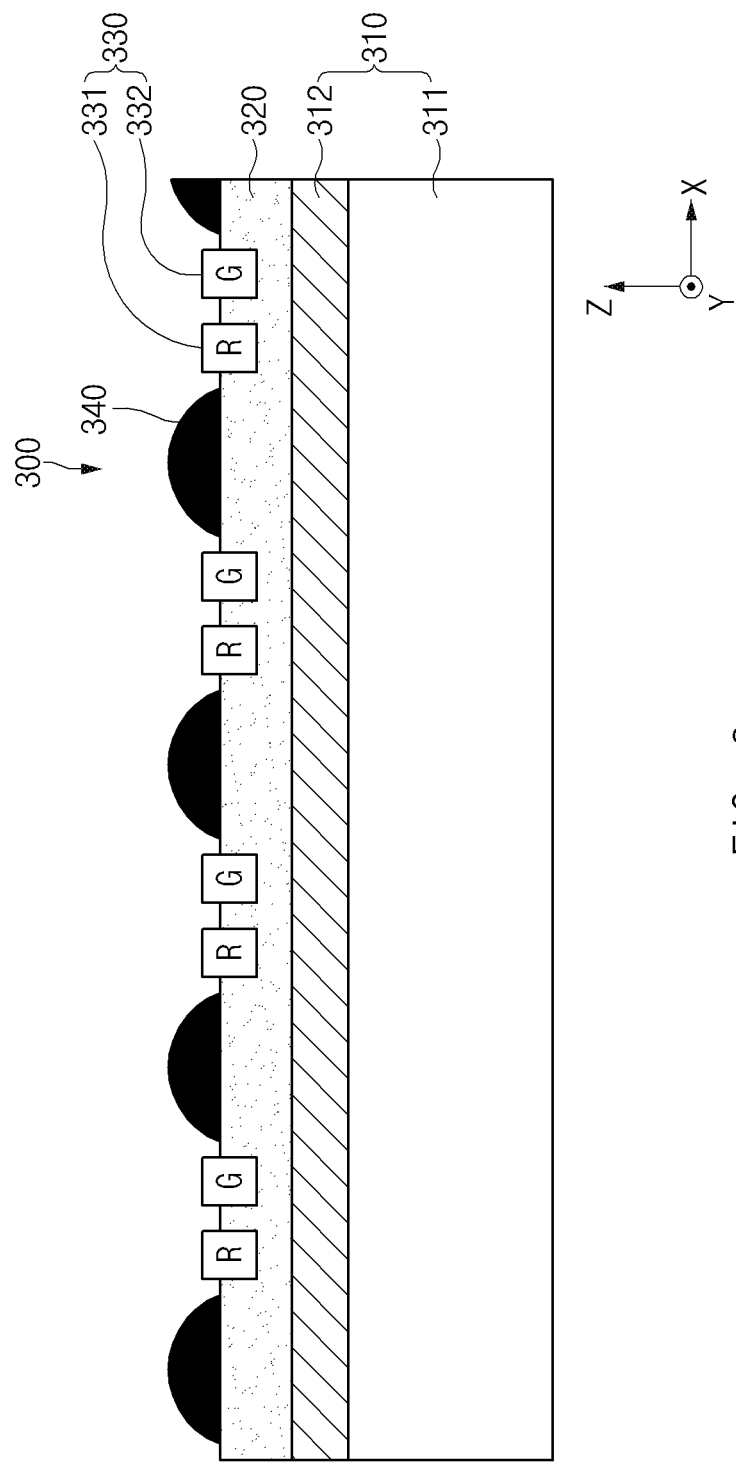
FIG. 3 is a sectional view illustrating an example display module according to an embodiment.

FIG. 3 is a sectional view illustrating an example display module 300 according to an embodiment. The display module 300 may include a substrate 310, a connecting member (e.g., including a conductive material) 320, a plurality of inorganic light emitting elements (e.g., including light emitting circuitry, such as, for example, a light emitting diode) 330, and a light blocking member (e.g., including an opaque material) 340. In the following drawings, a front side of the display module 300 faces a Z-axis direction, lateral sides of the display module 300 face an X-axis or Y-axis direction, and the Z-axis direction is directed upward.

In an embodiment, the substrate 310 may include a plurality of interconnection wires. The plurality of interconnection wires arranged on the substrate 310 may be connected to at least one inorganic light emitting element among the plurality of inorganic light emitting elements 330 to supply current.

In an embodiment, the substrate 310 may include a support substrate 311 and a thin film transistor (hereinafter, referred to as TFT) substrate 312.

In an embodiment, the support substrate 311 may form one side of the display module 300. For example, the support substrate 311 may form a rear side of the display module 300. The support substrate 311 may, for example, and without limitation, be comprise glass or plastic. The support substrate 311 may maintain the shape of the display module 300 and may protect the display module 300 from an external impact.

In an embodiment, the TFT substrate 312 may be disposed on one side of the support substrate 311. For example, the TFT substrate 312 may be disposed on an upper side of the support substrate 311. The TFT substrate 312 may include a plurality of electrodes connected with the display driver IC 230 (see, e.g., FIG. 2). The TFT substrate 312 may include, on an upper side thereof, a plurality of pads electrically connected with at least one inorganic light emitting element among the plurality of inorganic light emitting elements 330. The plurality of pads may be conductive. For example, the plurality of pads may be a plurality of metal pads. The TFT substrate 312 may include a plurality of interconnection wires connected with the plurality of electrodes and/or the plurality of pads.

In an embodiment, the connecting member 320 may be disposed on one side of the substrate 310. For example, the connecting member 320 may be disposed on (the term "on" as used herein covers both directly on and indirectly on, and thus the term "on" is not limited to being directly on or contacting) the upper side of the TFT substrate 312.

In an embodiment, the connecting member 320 may have the plurality of inorganic light emitting elements 330 mounted in preset positions on the connecting member 320. The connecting member 320 may fix the plurality of inorganic light emitting elements 330. The connecting member 320 may serve to hold the plurality of inorganic light emitting elements 330 in place on the connecting member 320.

In an embodiment, the connecting member 320 may electrically connect each of the plurality of inorganic light emitting elements 330 with at least one interconnection wire among the plurality of interconnection wires. The connecting member 320 may connect the plurality of inorganic light emitting elements 330 with the plurality of electrodes and/or the plurality of pads of the TFT substrate 312. For example, the connecting member 320 may include an anisotropic conductive film (hereinafter, referred to as ACF). In this case, the ACF may be attached to at least part of an emissive area on an upper side of the substrate 310. The ACF may be attached to the entire upper side of the substrate 310.

In an embodiment, the plurality of inorganic light emitting elements 330 may be arranged on the connecting member 320. The plurality of inorganic light emitting elements 330 may be connected with the plurality of interconnection wires included in the substrate 310. The plurality of inorganic light emitting elements 330 may be connected with the plurality of electrodes and/or the plurality of pads included in the TFT substrate 312. The plurality of inorganic light emitting elements 330 may be supplied with current and may emit light having specified colors. For example, the plurality of inorganic light emitting elements 330 may include a red light element 331 that emits red light and a green light element 332 that emits green light. The plurality of inorganic light emitting elements 330 may emit light by themselves using inorganic materials. For example, each of the plurality of inorganic light emitting elements 330 may be a micro light emitting diode (μLED).

In an embodiment, the display module 300 having μLEDs applied thereto may refer, for example, to a display module 300 including densely arranged micrometer (μm)-scale LEDs having, for example, and without limitation, an area less than about 0.01 times to about 0.1 times the area of a light emitting diode chip (LED chip) and may be too small to be identified with eyes. The μLEDs have high response speed, consume low power, and have high luminance. The μLEDs are capable of implementing high resolution and excellent color, contrast, and brightness.

In an embodiment, the μLEDs may accurately represent a wide range of colors and may implement a clear screen even outdoors in bright sunlight. Furthermore, the μLEDs may ensure a long service life without deformation due to high resistance to burn-in and low heat. The μLEDs are appropriate for a virtual reality (VR) or augmented reality (AR) display module, which has to display rapidly changing images, because the μLEDs are capable of rapidly changing colors in nanoseconds. For example, the μLEDs may be used in a display module, such as, for example, and without limitation, a light, a bio-contact lens, a medical patch, a medical field, a wearable display, a camera module, a head up display (HUD), or the like, for which low-power consumption, down-sizing, and light weight are preferred.

In an embodiment, a portion of each of the plurality of inorganic light emitting elements 330 may pass through a portion of the connecting member 320 and may be spaced apart from the substrate 310. Lower portions of the plurality of inorganic light emitting elements 330 may be surrounded by the connecting member 320. Upper portions of the plurality of inorganic light emitting elements 330 may be exposed. For example, in the case where the connecting member 320 has a thickness of not less than about 5 μm and not more than about 10 μm in the Z-axis direction and the plurality of inorganic light emitting elements 330 have a length of not less than about 4 μm and not more than about 5 μm in the Z-axis direction, the plurality of inorganic light emitting elements 330 may pass through the connecting member 320 by a distance of not less than about 3 μm and nor more than about 4 μm in a lower direction and may be exposed upwards by a distance of not less than about 1 μm and not more than about 2 μm. The plurality of inorganic light emitting elements 330 may be attached to the connecting member 320 by, for example, being pressed in the Z-axis direction after aligned in preset positions on the connecting member 320.

In an embodiment, the light blocking member 340 may include, for example, an opaque (or substantially opaque) material and be disposed on a region other than the regions where the plurality of inorganic light emitting elements 330 are disposed. The light blocking member 340 may prevent and/or reduce the mixture of light emitted from different pixels among the plurality of inorganic light emitting elements 330. For example, the light blocking member 340 may prevent and/or reduced the mixture of red light emitted from the red light element 331 and green light emitted from the green light element 332 of adjacent pixels among the plurality of inorganic light emitting elements 330.

In an embodiment, the light blocking member 340 may include a black matrix (hereinafter, referred to as BM). The BM may represent a black gradation or a black color between a pixel and a pixel or between the plurality of inorganic light emitting elements 330. The light blocking member 340 including the BM may increase the contrast ratio (hereinafter, referred to as CR) of the display module 300.

In an embodiment, the light blocking member 340 may be patterned and disposed so as not to overlap the plurality of inorganic light emitting elements 330. For example, the light blocking member 340 may be applied, for example, and without limitation, by a jetting method using a jetting head, a printing method using a printing apparatus, or the like. The light blocking member 340 may, for example, be formed by applying black ink to the connecting member 320.

In an embodiment, the light blocking member 340 may be spaced apart from the substrate 310 and disposed on the connecting member 320. For example, the light blocking member 340 may be disposed on an upper side of the connecting member 320. The light blocking member 340 may be disposed on at least one side of the plurality of inorganic light emitting elements 330. The light blocking member 340 and the TFT substrate 312 may be spaced apart from each other by a specified distance in the Z-axis direction by the thickness of the connecting member 320.

In an embodiment, the light blocking member 340 may be spaced apart from the plurality of inorganic light emitting elements 330. The light blocking member 340 including the BM may block light emitted from the plurality of inorganic light emitting elements 330 to prevent and/or reduce the light from passing though the light blocking member 340. In the case where the light blocking member 340 including the BM is in contact with lateral sides of the plurality of inorganic light emitting elements 330, the light blocking member 340 may block light emitted from the lateral sides of the plurality of inorganic light emitting elements 330, and therefore the viewing angle of the display module 300 may be reduced. The light blocking member 340 may be laterally spaced apart from the plurality of inorganic light emitting elements 330 by a specified distance. For example, the BM may be applied so as not to make contact with the plurality of inorganic light emitting elements 330, for example, according to settings of the jetting head.

Figure 4:
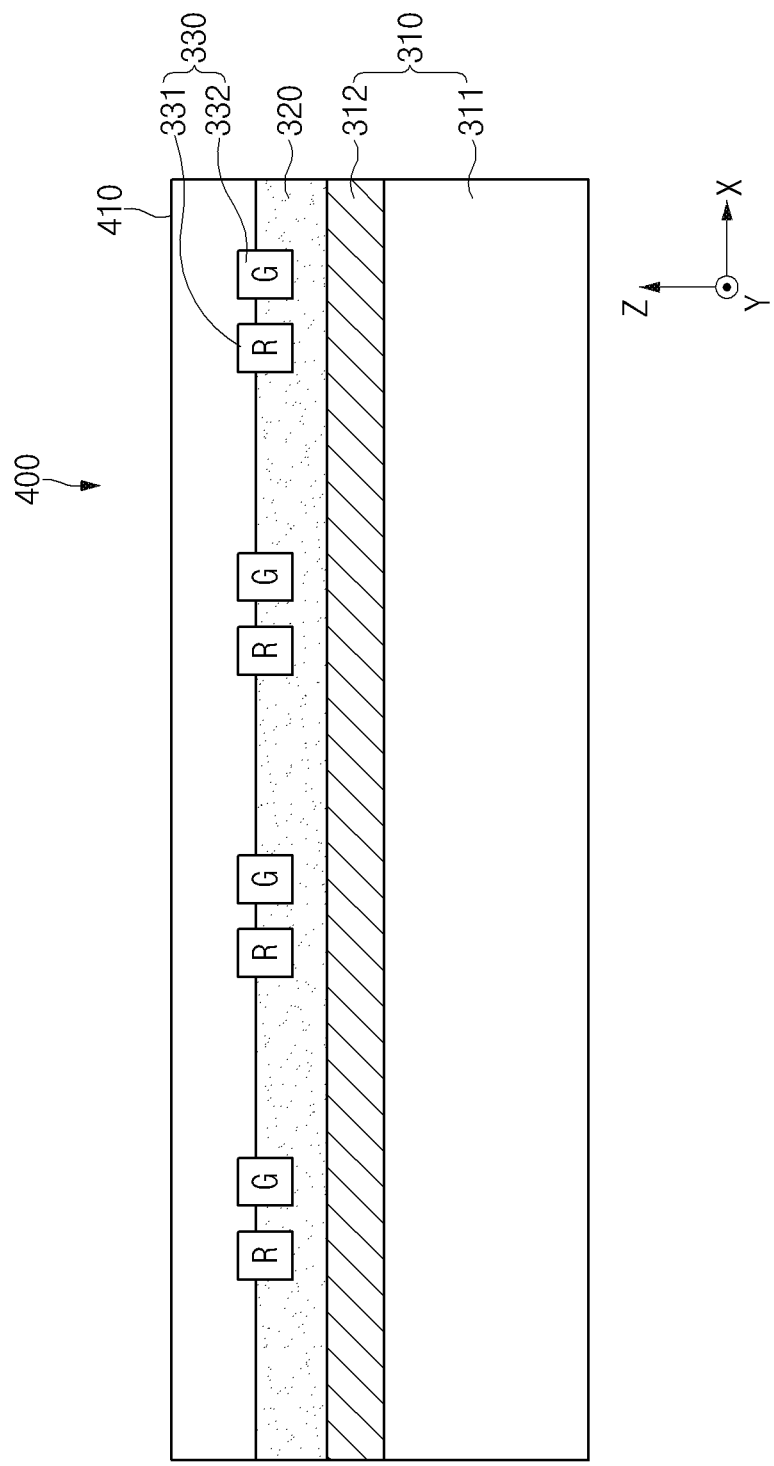
FIG. 4 is a sectional view illustrating an example display module according to another embodiment.

FIG. 4 is a sectional view illustrating an example display module 400 according to an embodiment. The display module 400 may include a substrate 310, a connecting member (e.g., including a conductive material) 320, a plurality of inorganic light emitting elements (e.g., including light emitting circuitry, for example, a light emitting diode) 330, and a transparent layer (e.g., including a transparent material) 410. The substrate 310, the connecting member 320, and the plurality of inorganic light emitting elements 330 of FIG. 4 may be components substantially identical to or similar to the substrate 310, the connecting member 320, and the plurality of inorganic light emitting elements 330 described above in relation to FIG. 3. Descriptions of the identical components may not be repeated here.

In an embodiment, the transparent layer 410 may be disposed on the connecting member 320 and the plurality of inorganic light emitting elements 330. For example, the transparent layer 410 may be disposed on an upper side of the connecting member 320 and upper sides of the plurality of inorganic light emitting elements 330. The transparent layer 410 may include a polymer compound with excellent light transmittance. For example, the transparent layer 410 may comprise, for example, and without limitation, a clear resin, an optical clear resin (hereinafter, referred to as OCR), or the like. The OCR may enhance luminance and may be cured by ultraviolet (UV) light. The OCR may have an adhesive force, and therefore an additional protective layer may be disposed on the transparent layer 410.

In an embodiment, the connecting member 320 may include a conductive material for electrically connecting the plurality of inorganic light emitting elements 330 with a plurality of interconnection wires included in the substrate 310. The surface of the connecting member 320 may include a bumpy structure of the conductive material. The upper side of the connecting member 320 may not be smooth like a mirror, and therefore light emitted from the plurality of inorganic light emitting elements 330 may be diffusely reflected, which may lead to a decrease in the transparency of the display module 400. The transparency of the display module 400 may be increased by applying the transparent layer 410 to the upper side of the connecting member 320. In the case of increasing the transparency of the display module 400, the color of the substrate 310 covered with the connecting member 320 may appear to be dark, and thus the CR of the display module 400 may be improved.

Figure 5:
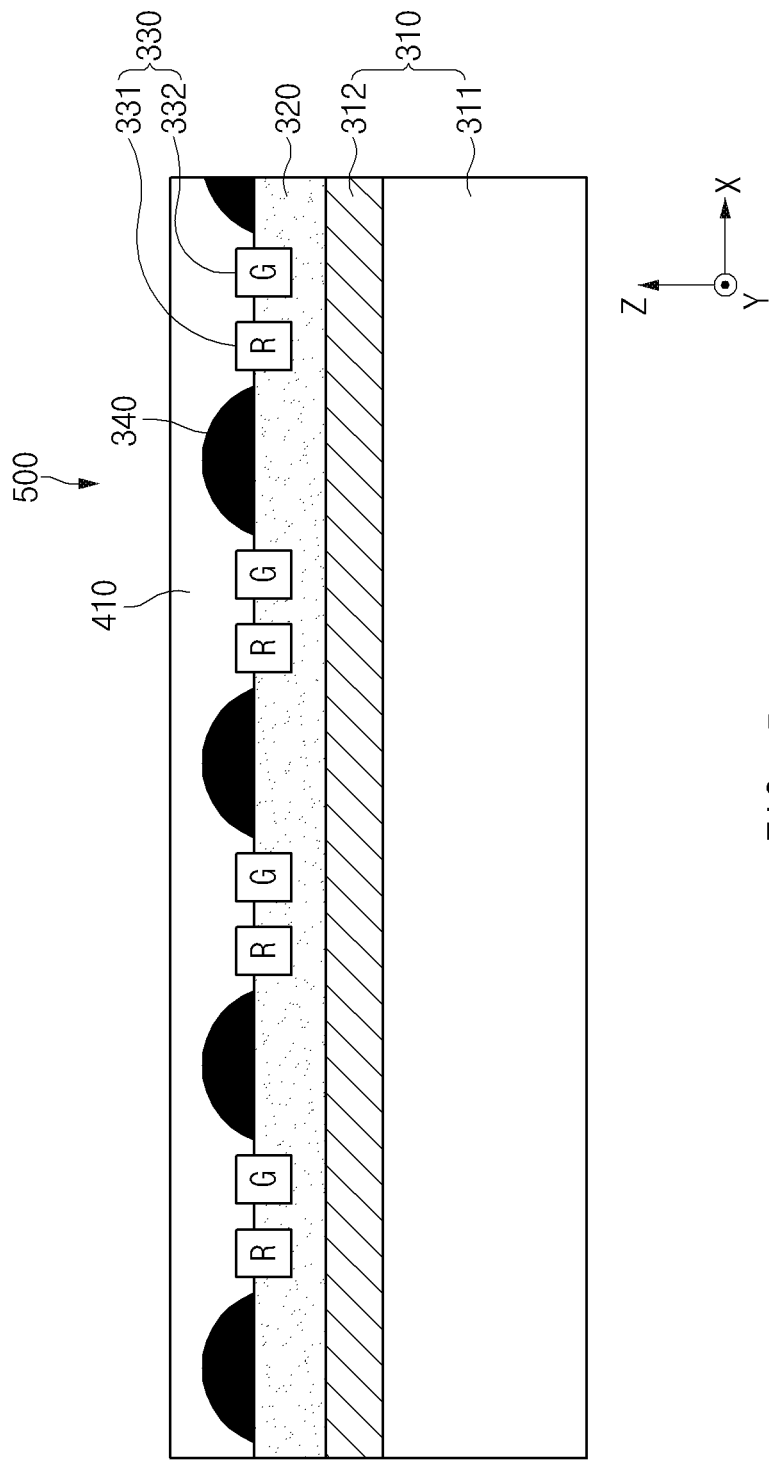
FIG. 5 is a sectional view illustrating an example display module according to another embodiment.

FIG. 5 is a sectional view illustrating an example display module 500 according to an embodiment. The display module 500 may include a substrate 310, a connecting member (e.g., including a conductive material) 320, a plurality of inorganic light emitting elements (e.g., including light emitting circuitry, for example, a light emitting diode) 330, a light blocking member (e.g., including an opaque material) 340, and a transparent layer (e.g., including a transparent material) 410. The substrate 310, the connecting member 320, the plurality of inorganic light emitting elements 330, and the light blocking member 340 of FIG. 5 may be components substantially identical to or similar to the substrate 310, the connecting member 320, the plurality of inorganic light emitting elements 330, and the light blocking member 340 described above in relation to FIG. 3. Furthermore, the transparent layer 410 of FIG. 5 may be a component substantially identical to or similar to the transparent layer 410 described above in relation to FIG. 4.

In an embodiment, the transparent layer 410 may be disposed on the plurality of inorganic light emitting elements 330 and the light blocking member 340. For example, the transparent layer 410 may be disposed on upper sides of the plurality of inorganic light emitting elements 330 and an upper side of the light blocking member 340. The transparent layer 410 may be integrally formed with an upper portion of the connecting member 320, upper portions of the plurality of inorganic light emitting elements 330, and an upper portion of the light blocking member 340.

In an embodiment, the light blocking member 340 may be applied between the plurality of inorganic light emitting elements 330. The transparent layer 410 may be applied all over the surface. The transparent layer 410 may include a material having no repulsive force on the light blocking member 340. In the case of applying both the light blocking member 340 and the transparent layer 410 to the display module 500, the CR of the display module 500 may be further improved.

Figure 6:
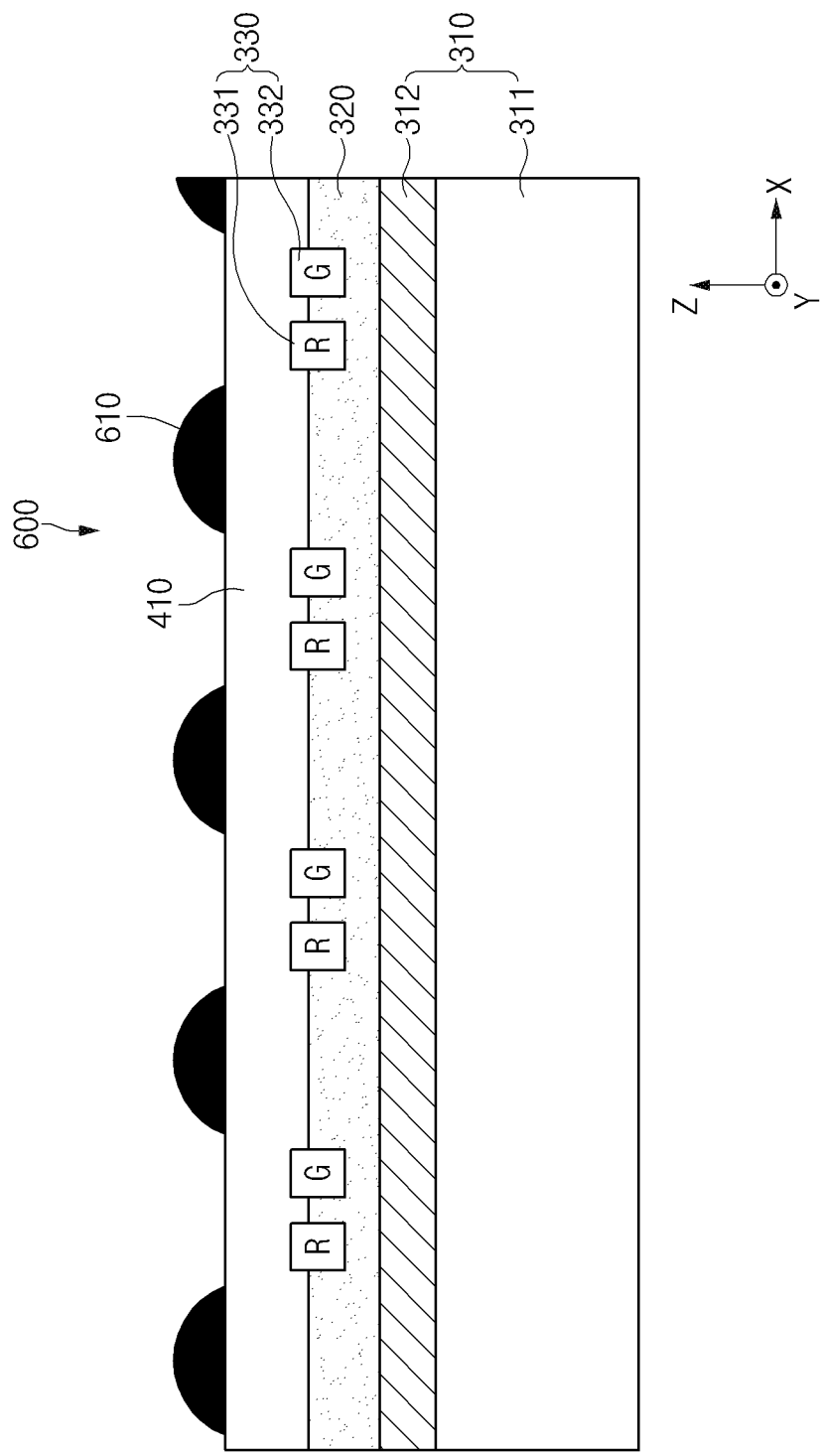
FIG. 6 is a sectional view illustrating an example display module according to another embodiment.

FIG. 6 is a sectional view illustrating an example display module 600 according to another embodiment. The display module 600 may include a substrate 310, a connecting member (e.g., including a conductive material) 320, a plurality of inorganic light emitting elements (e.g., including light emitting circuitry, for example, a light emitting diode) 330, a transparent layer (e.g., including a transparent material) 410, and a light blocking member (e.g., including an opaque material) 610. The substrate 310, the connecting member 320, and the plurality of inorganic light emitting elements 330 of FIG. 6 may be components substantially identical to or similar to the substrate 310, the connecting member 320, and the plurality of inorganic light emitting elements 330 described above in relation to FIG. 3. Furthermore, the transparent layer 410 of FIG. 6 may be a component substantially identical to or similar to the transparent layer 410 described above in relation to FIG. 4.

In an embodiment, the transparent layer 410 may be disposed on the connecting member 320 and the plurality of inorganic light emitting elements 330, and the light blocking member 610 may be disposed on the transparent layer 410. For example, the light blocking member 610 may be disposed on an upper side of the transparent layer 410. The light blocking member 610 may be disposed so as not to overlap the plurality of inorganic light emitting elements 330. The light blocking member 610 may include a material having no repulsive force on the transparent layer 410.

In an embodiment, the transparent layer 410 may be applied all over the surface. The light blocking member 610 may be applied to a region of the upper side of the transparent layer 410 that does not overlap the regions where the plurality of inorganic light emitting elements 330 are disposed, with respect to the Z-axis direction. In the case where the transparent layer 410 is applied all over the surface and the light blocking member 610 is applied, the light blocking member 610 may be prevented from and/or avoid invading lateral sides or upper sides of the plurality of inorganic light emitting elements 330 when applied.

In an embodiment, in the case where the light blocking member 610 is disposed on the upper side of the transparent layer 410, a coating layer may be disposed on the upper side of the transparent layer 410. The coating layer may be configured such that the light blocking member 610 is removable from the transparent layer 410. In the case where an error in alignment occurs while the light blocking member 340 is applied between the plurality of inorganic light emitting elements 330, re-work to apply the light blocking member 340 again is impossible due to damage to the plurality of inorganic light emitting elements 330. In the case where the coating layer is disposed on the upper side of the transparent layer 410, re-working of the light blocking member 610 may be easy when an error in alignment of the light blocking member 610 occurs.

Figure 7A:
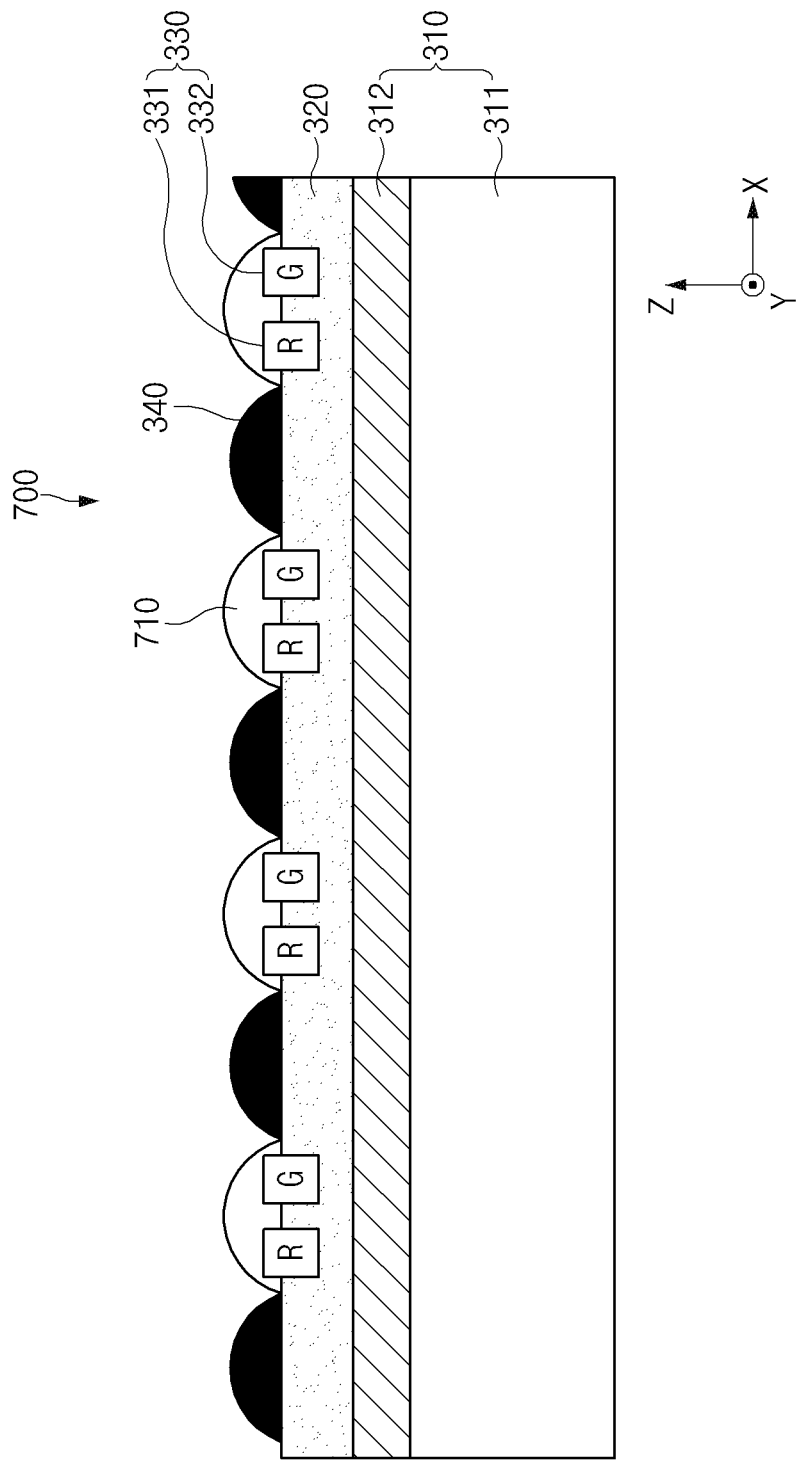
FIGS. 7A and 7B are sectional views illustrating an example display module according to another embodiment.
Figure 7B:
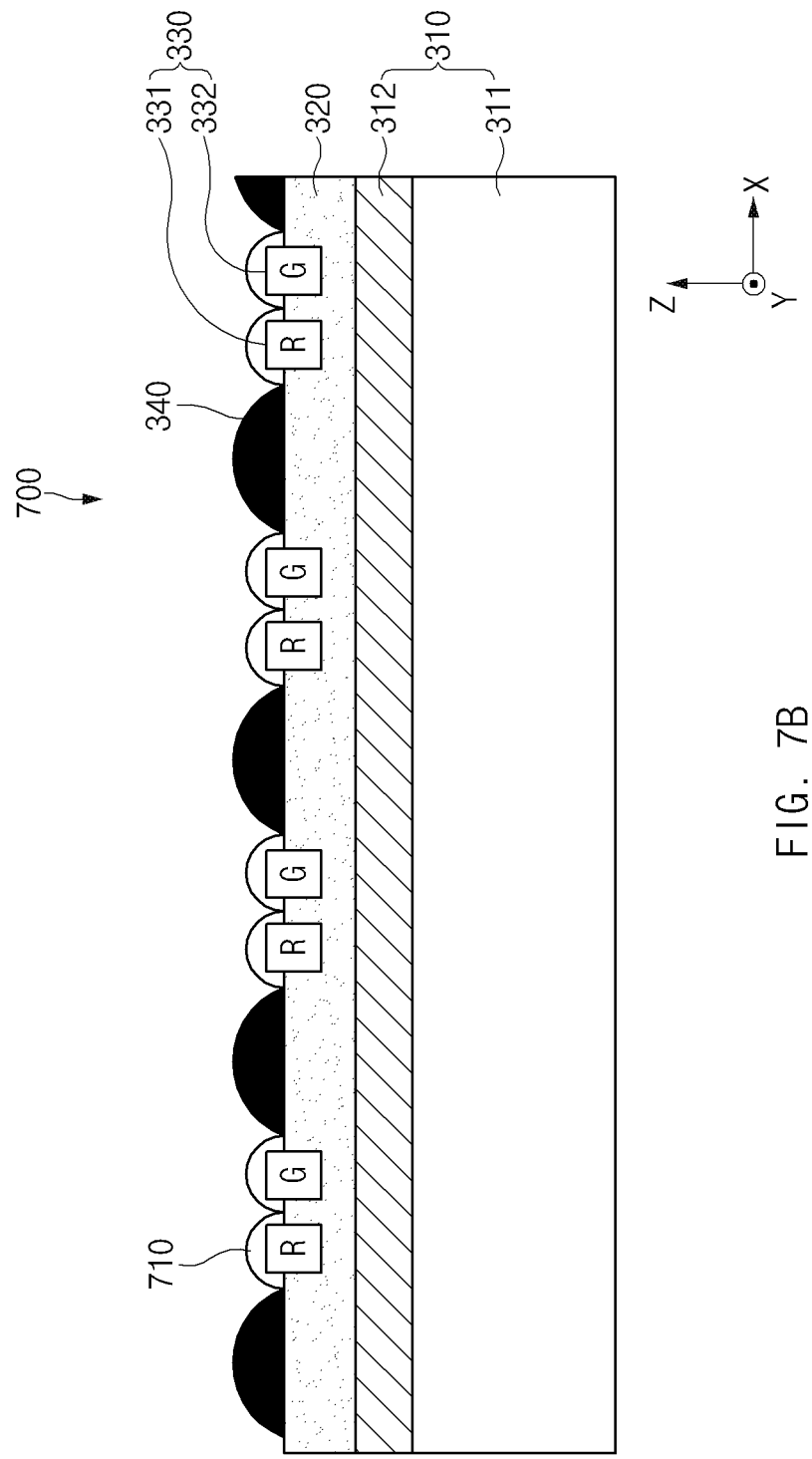

FIGS. 7A and 7B are sectional views illustrating an example display module 700 according to another embodiment. The display module 700 may include a substrate 310, a connecting member (e.g., including a conductive material) 320, a plurality of inorganic light emitting elements (e.g., including light emitting circuitry, for example, a light emitting diode) 330, a light blocking member (e.g., including an opaque material) 340, and a first transparent pattern (e.g., including a transparent material) 710. The substrate 310, the connecting member 320, the plurality of inorganic light emitting elements 330, and the light blocking member 340 of FIGS. 7A and 7B may be components substantially identical to or similar to the substrate 310, the connecting member 320, the plurality of inorganic light emitting elements 330, and the light blocking member 340 described above in relation to FIG. 3.

In an embodiment, the first transparent pattern 710 may be disposed on the plurality of inorganic light emitting elements 330. For example, the first transparent pattern 710 may be disposed to surround upper sides and parts of lateral sides of the plurality of inorganic light emitting elements 330. The first transparent pattern 710 may be disposed on a region other than the region where the light blocking member 340 is disposed. The first transparent pattern 710 may include, for example, a polymer compound with excellent light transmittance. For example, the first transparent pattern 710 may be formed of a clear resin, or the like, but is not limited thereto. The first transparent pattern 710 may be partly applied to the upper sides of the plurality of inorganic light emitting elements 330. For example, the first transparent pattern 710 may be applied by a jetting method using a jetting head or a printing method using, for example, a printing apparatus, or the like, but the disclosure is not limited thereto.

In an embodiment, in the case of disposing the first transparent pattern 710 on the plurality of inorganic light emitting elements 330, the light blocking member 340 may be spaced apart from the plurality of inorganic light emitting elements 330. The first transparent pattern 710 and the light blocking member 340 may make contact with each other because the light blocking member 340 and the plurality of inorganic light emitting elements 330 are spaced apart from each other by the first transparent pattern 710. However, without being limited thereto, the first transparent pattern 710 and the light blocking member 340 may be spaced apart from each other within a range satisfying a specified CR.

In an embodiment, the first transparent pattern 710 may adjust a patterned unit size to satisfy the specified CR and increase the degree of freedom in manufacturing or design.

For example, as illustrated in FIG. 7A, the first transparent pattern 710 may be formed on the plurality of inorganic light emitting elements 330 forming one pixel. In this case, upper portions of a red light element 331 and a green light element 332 that form one pixel may be covered with one first transparent pattern 710.

In another example, as illustrated in FIG. 7B, the first transparent pattern 710 may be formed on an element-by-element basis. In this example, one first transparent pattern 710 may cover the red light element 331, and another first transparent pattern 710 may cover the upper portion of the green light element 332. The first transparent patterns 710 may be separately formed to cover the upper portions of the inorganic light emitting elements 331 and 332 forming one pixel (the term "cover" as used herein may refer, for example, to overlapping when viewed from a normal viewing direction, e.g., Z+ direction).

In an embodiment, the light blocking member 340 and the first transparent pattern 710 may have repulsive forces therebetween. A repellent liquid characteristic may be formed between the light blocking member 340 and the first transparent pattern 710. Because the viewing angle is reduced in the case where the light blocking member 340 spreads along a lateral side of the first transparent pattern 710, it is advantageous that the repellent liquid characteristic between the light blocking member 340 and the first transparent pattern 710 increases. FIGS. 7A and 7B illustrate a case in which the first transparent pattern 710 is in an island shape and the first transparent pattern 710 and the light blocking member 340 have a complete repellent liquid characteristic. In the case where the first transparent pattern 710 and the light blocking member 340 have the complete repellent liquid characteristic, the light blocking member 340 may be more assuredly prevented from and/or avoid invading the first transparent pattern 710 or making contact with the plurality of inorganic light emitting elements 330 when the light blocking member 340 is applied after the first transparent pattern 710.

In an embodiment, the first transparent pattern 710 may be disposed on the plurality of inorganic light emitting elements 330 to prevent and/or avoid the light blocking member 340 from invading the lateral sides or the upper sides of the plurality of inorganic light emitting elements 330. Furthermore, by disposing the first transparent pattern 710 on a region other than the region where the light blocking member 340 is disposed, the height of the upper side of the light blocking member 340 may be lowered, and thus the viewing angle of the display module 700 may be more easily ensured.

Figure 8:
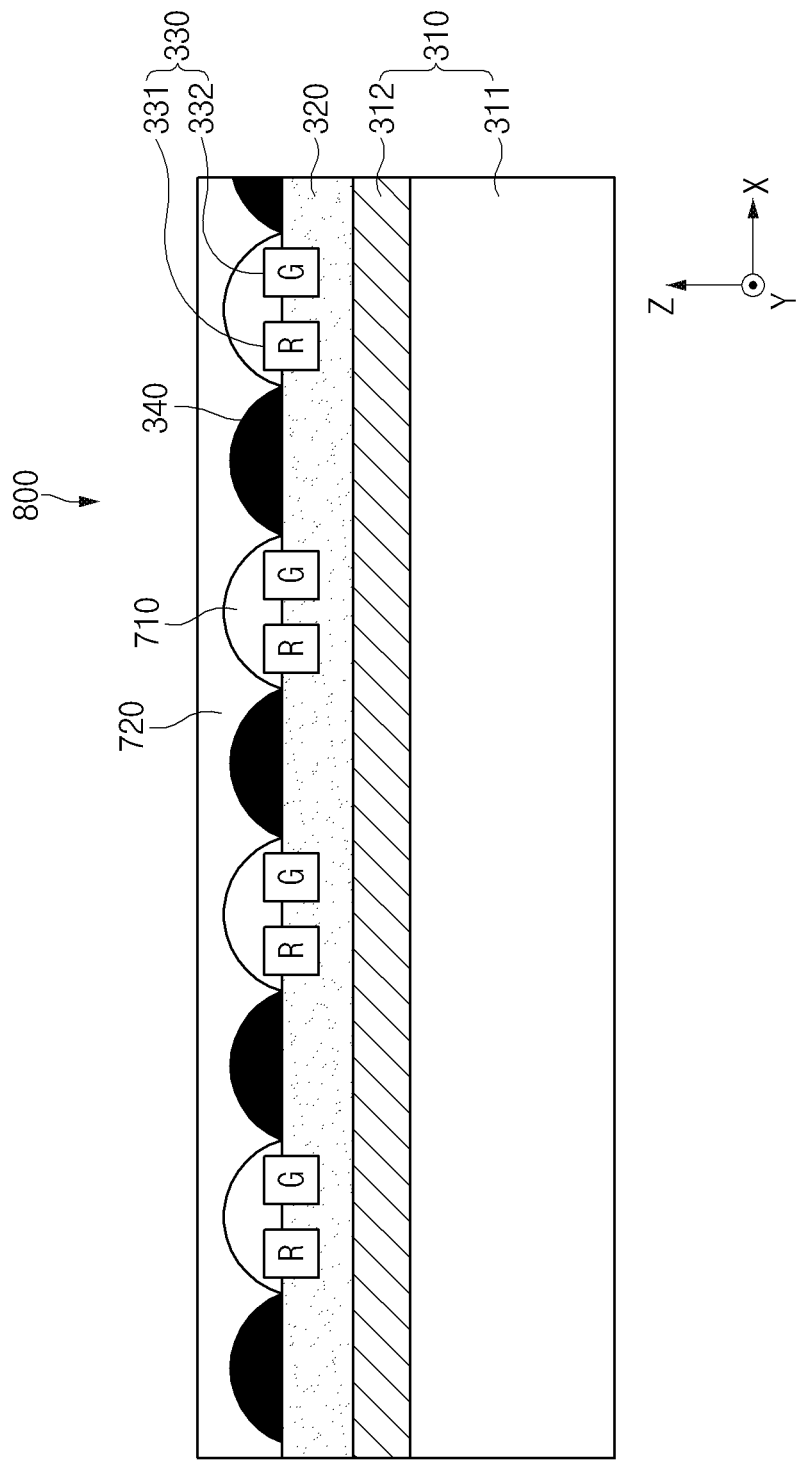
FIG. 8 is a sectional view illustrating an example display module according to another embodiment.

FIG. 8 is a sectional view illustrating an example display module 800 according to an embodiment. The display module 800 may include a substrate 310, a connecting member (e.g., including a conductive material) 320, a plurality of inorganic light emitting elements (e.g., including light emitting circuitry, for example, a light emitting diode) 330, a light blocking member (e.g., including an opaque material) 340, a first transparent pattern (e.g., including a transparent material) 710, and a second transparent pattern (e.g., including a transparent material) 720. The substrate 310, the connecting member 320, the plurality of inorganic light emitting elements 330, and the light blocking member 340 of FIG. 8 may be components substantially identical to or similar to the substrate 310, the connecting member 320, the plurality of inorganic light emitting elements 330, and the light blocking member 340 described above in relation to FIG. 3. Furthermore, the first transparent pattern 710 of FIG. 8 may be a component substantially identical to or similar to the first transparent pattern 710 described above in relation to FIGS. 7A and 7B.

In an embodiment, the second transparent pattern 720 may be disposed on the light blocking member 340 and the first transparent pattern 710. For example, the second transparent pattern 720 may be disposed to surround an upper side of the light blocking member 340 and an upper portion of the first transparent pattern 710. The second transparent pattern 720 may include, for example, a polymer compound with excellent light transmittance. For example, the second transparent pattern 720 may be formed of a clear resin, or the like, but is not limited thereto.

In an embodiment, the second transparent pattern 720 may uniformly cover an upper side of the connecting member 320. The second transparent pattern 720 may include a material having no repulsive force on the light blocking member 340 and the first transparent pattern 710. After the first transparent pattern 710 is partly applied to upper portions of the plurality of inorganic light emitting elements 330, the light blocking member 340 may be applied to a region other than the regions where the plurality of inorganic light emitting elements 330 are disposed, and the second transparent pattern 720 may be applied to the entire upper side.

In an embodiment, in the case of uniformly covering the entire upper side of the connecting member 320 with the second transparent pattern 720, depressions generated on the upper side of the connecting member 320 by the light blocking member 340 and the first transparent pattern 710 may be flattened. Accordingly, a change in light emitting characteristics by the convex shape of the first transparent pattern 710 may be compensated for.

Figure 9:
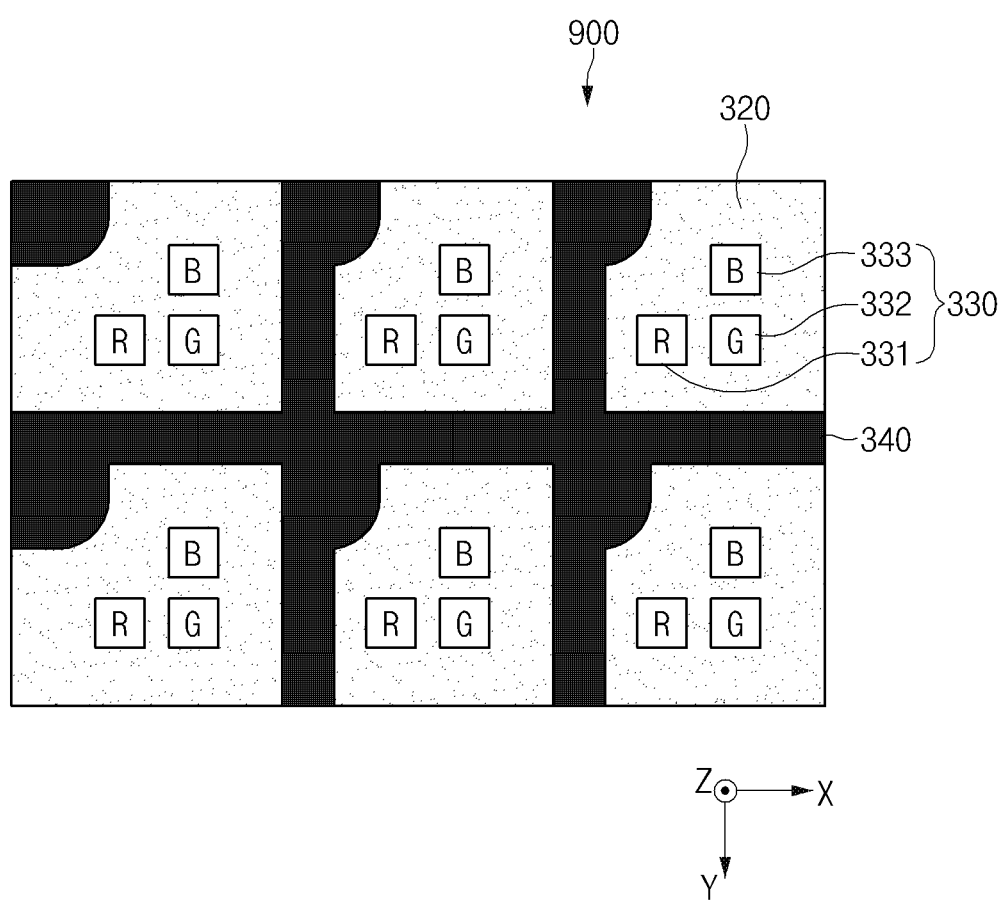
FIG. 9 is a front view illustrating an example display module according to various embodiments.

FIG. 9 is a front view illustrating an example display module 900 according to various embodiments. The display module 900 may include a connecting member (e.g., including a conductive material) 320, a plurality of inorganic light emitting elements (e.g., including light emitting circuitry, for example, a light emitting diode) 330, and a light blocking member (e.g., including an opaque material) 340. The connecting member 320, the plurality of inorganic light emitting elements 330, and the light blocking member 340 of FIG. 9 may be components substantially identical to or similar to the connecting member 320, the plurality of inorganic light emitting elements 330, and the light blocking member 340 described above in relation to FIG. 3.

In an embodiment, the plurality of inorganic light emitting elements 330 may be grouped and arranged by pixels. The plurality of inorganic light emitting elements 330 may be continuously arranged in all directions on the XY plane. The plurality of inorganic light emitting elements 330 may each include a red light element 331 that emits red light, a green light element 332 that emits green light, and a blue light element 333 that emits blue light. One pixel formed by the plurality of inorganic light emitting elements 330 may include RGB sub-pixels.

In an embodiment, the plurality of inorganic light emitting elements 330 may be arranged in a pentile structure. For example, the red light element 331, the green light element 332, and the blue light element 333 may be disposed on a lower left side, a lower right side, and an upper right side of one pixel with respect to the XY plane. However, without being limited thereto, the red light element 331, the green light element 332, and the blue light element 333 may be disposed in three positions among an upper left side, a lower left side, an upper right side, and a lower right side of one pixel.

In an embodiment, the connecting member 320 may be disposed on a substrate 310. The connecting member 320 may be uniformly formed on an upper side of the substrate 310. The connecting member 320 may be implemented using an ACF. The connecting member 320 may fix the plurality of inorganic light emitting elements 330 in specified positions. The connecting member 320 may supply current to the plurality of inorganic light emitting elements 330.

In an embodiment, the light blocking member 340 may be disposed to distinguish between the plurality of inorganic light emitting elements 330 by pixels. The light blocking member 340 may be continuously arranged in all directions on the XY plane. The light blocking member 340 may have a matrix structure on the XY plane. The light blocking member 340 may have various forms as described above, depending on the arrangement of the plurality of inorganic light emitting elements 330. For example, in the case where no sub-pixel is disposed on an upper left side of one pixel with respect to the XY plane, the light blocking member 340 may cover at least part of the upper left side of the one pixel.

In an embodiment, a black gradation having a feeling of dark black or a low brightness may be increased as the CR of the display module 900 increases. The black gradation may be increased with an increase in the area of the light blocking member 340. In other words, a high black gradation may be represented as an aperture ratio decreases. Accordingly, the light blocking member 340 may be disposed on a region other than the regions where the plurality of inorganic light emitting elements 330 are disposed. However, the viewing angle of the display module 900 may be reduced in the case where the light blocking member 340 makes contact with the plurality of inorganic light emitting elements 330. Therefore, the light blocking member 340 may be disposed under the condition that the light blocking member 340 does not make contact with the plurality of inorganic light emitting elements 330.

Figure 10A:
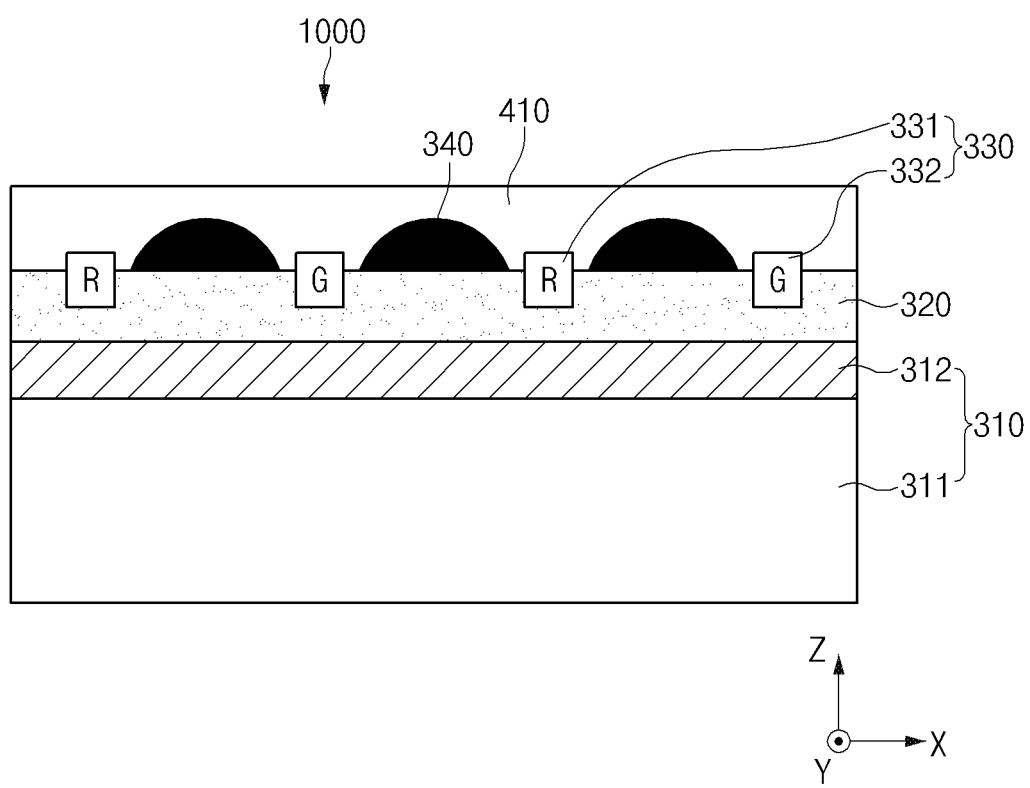
FIG. 10A is a sectional view illustrating an example display module according to another embodiment.
Figure 10B:
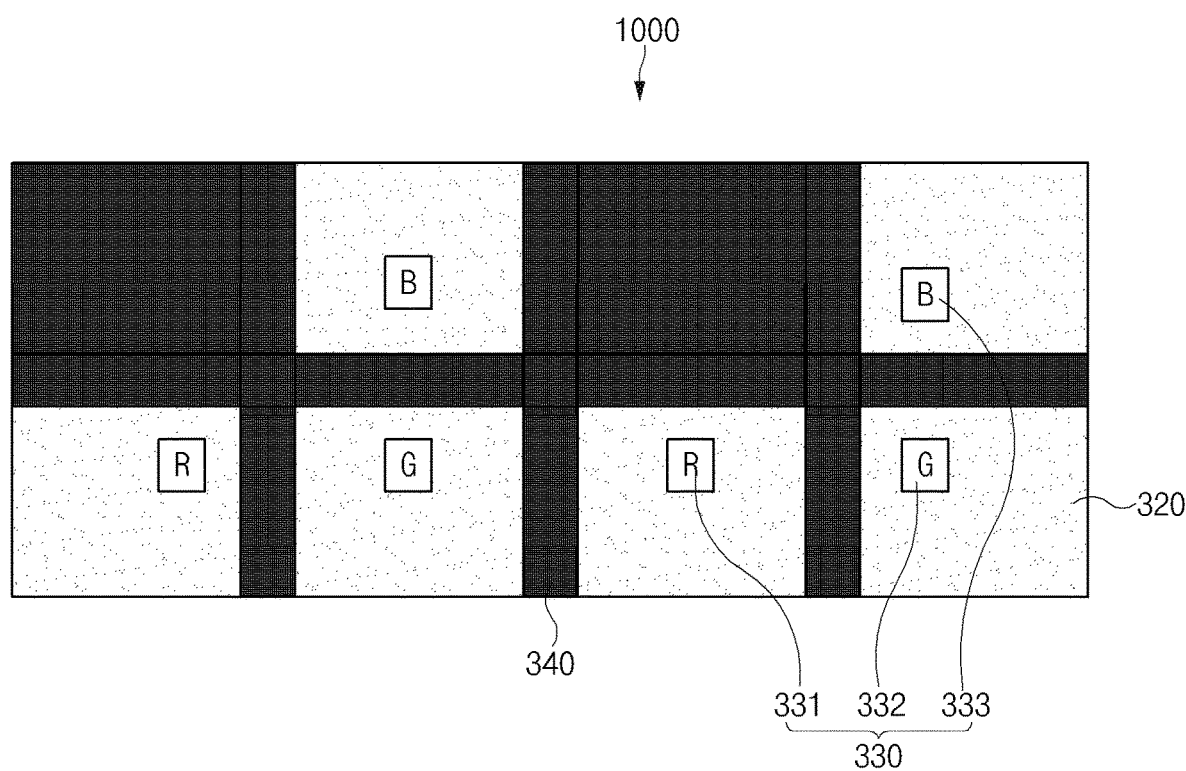
FIG. 10B is a front view illustrating the example display module according to the other embodiment.

FIG. 10A is a sectional view illustrating an example display module 1000 according to another embodiment. FIG. 10B is a front view illustrating the example display module 1000 according to the other embodiment. The display module 1000 may include a substrate 310, a connecting member (e.g., including a conductive material) 320, a plurality of inorganic light emitting elements (e.g., including light emitting circuitry, for example, a light emitting diode) 330, and a light blocking member (e.g., including an opaque material) 340. The substrate 310, the connecting member 320, the plurality of inorganic light emitting elements 330, and the light blocking member 340 of FIG. 10A may be components substantially identical to or similar to the substrate 310, the connecting member 320, the plurality of inorganic light emitting elements 330, and the light blocking member 340 described above in relation to FIG. 3.

In an embodiment, the light blocking member 340 may be disposed between the plurality of inorganic light emitting elements 330 forming one pixel. For example, the light blocking member 340 may be additionally disposed between a red light element 331 and a green light element 332 that form one pixel.

In the case of additionally disposing the light blocking member 340 between the plurality of inorganic light emitting elements 330 forming one pixel, the CR of the display module 100 may be further improved.

Figure 11A:
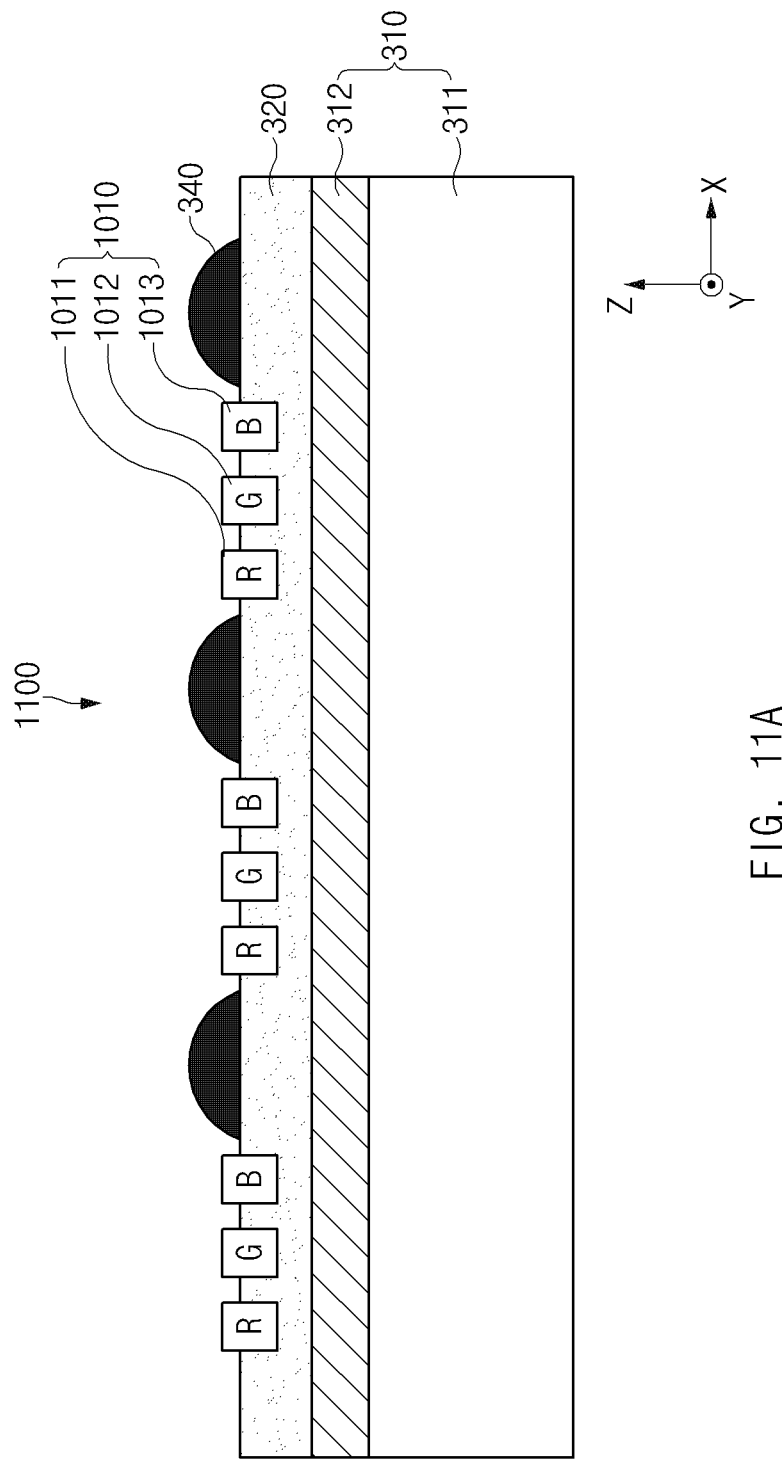
FIG. 11A is a sectional view illustrating an example display module according to another embodiment.

FIG. 11A is a sectional view illustrating an example display module 1100 according to another embodiment. The display module 1100 may include a substrate 310, a connecting member (e.g., including a conductive material) 320, a plurality of inorganic light emitting elements (e.g., including light emitting circuitry, for example, a light emitting diode) 1010, and a light blocking member (e.g., including an opaque material) 340. The substrate 310, the connecting member 320, and the light blocking member 340 of FIG. 11A may be components substantially identical to or similar to the substrate 310, the connecting member 320, and the light blocking member 340 described above in relation to FIG. 3.

In an embodiment, the plurality of inorganic light emitting elements 1010 may be arranged on the connecting member 320. The plurality of inorganic light emitting elements 1010 may include a red light element 1011 that emits red light, a green light element 1012 that emits green light, and a blue light element 1013 that emits blue light.

In an embodiment, the red light element 1011, the green light element 1012, and the blue light element 1013 included in the plurality of inorganic light emitting elements 1010 may implement RGB sub-pixels in one pixel.

In an embodiment, the plurality of inorganic light emitting elements 1010 may be red, green, and blue semiconductor light emitting elements that form sub-pixels. For example, the plurality of inorganic light emitting elements 1010 may be μLED elements.

In an embodiment, the μLED elements may have a length and a width of not less than about 1 μm and not more than about 100 μm. The μLED elements may, for example, be manufactured by growing a thin film on a substrate, such as a sapphire substrate or a silicon substrate, using an inorganic material such as aluminum (Al), gallium (Ga), nitrogen (N), phosphor (P), arsenic (As), or indium (In).

In an embodiment, the plurality of inorganic light emitting elements 1010 may, for example, and without limitation, have a lateral electrode structure, a vertical electrode structure, a flip chip structure, or the like, according to a manufacturing process. The lateral electrode structure may refer, for example, to a structure in which a cathode and an anode are spaced apart from each other on a substrate without overlapping each other. The vertical electrode structure may refer, for example, to a structure in which a cathode and an anode are vertically superimposed on each other. The flip chip structure may refer, for example, to a structure in which a chip is fused as it is, using an electrode pattern on a lower side of the chip without a separate connecting structure such as a metal lead or wire. The flip chip structure may, for example, be referred to as a leadless chip structure.

In an embodiment, in the lateral electrode structure and the vertical electrode structure, a separate connecting structure is used to attach a semiconductor chip to a circuit board. These structures may have a limitation in compactness and high density integration of elements and may have low manufacturing efficiency, in particular, in manufacturing medium and large displays. In the flip chip structure, a space required for a separate connecting structure may be omitted because an electrode does not limit an emissive area and no separate connecting structure is used in combining the electrode with a substrate. Accordingly, the flip chip structure may be advantageous in compactness, light weight, and high density integration of elements. Furthermore, the flip chip structure may improve luminous efficiency and transfer process efficiency in manufacturing a display device and hence is widely applied to a μLED field.

Figure 11B:
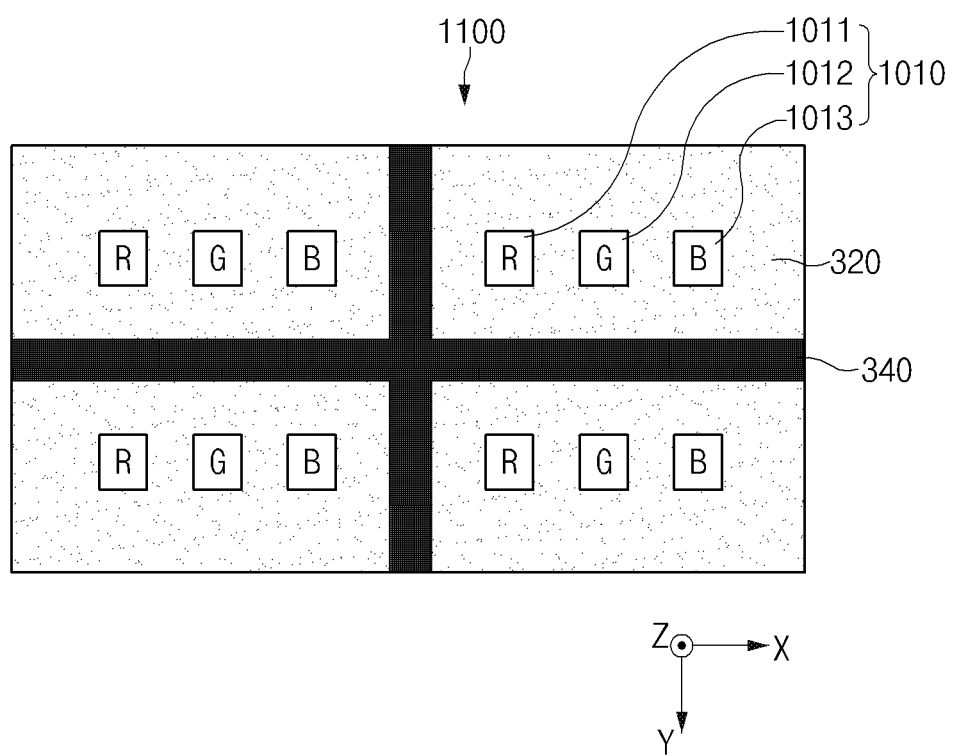
FIG. 11B is a front view illustrating an example display module according to another embodiment.

FIG. 11B is a front view illustrating a display module 1100 according to another embodiment. The display module 1100 may include a connecting member (e.g., including a conductive material) 320, a plurality of inorganic light emitting elements (e.g., including light emitting circuitry, for example, a light emitting diode) 1010, and a light blocking member (e.g., including an opaque material) 340. The connecting member 320 and the light blocking member 340 of FIG. 11B may be components substantially identical to or similar to the connecting member 320 and the light blocking member 340 described above in relation to FIG. 3. Furthermore, the plurality of inorganic light emitting elements 1010 of FIG. 11B may be components substantially identical to or similar to the plurality of inorganic light emitting elements 1010 described above in relation to FIG. 11A.

In an embodiment, the plurality of inorganic light emitting elements 1010 may be grouped and arranged by pixels. The plurality of inorganic light emitting elements 1010 may be arranged in an RGB stripe structure. The plurality of inorganic light emitting elements 1010 forming one pixel may, for example, be arranged in a row. The plurality of inorganic light emitting elements 1010 forming one pixel may be arranged in a row in the X-axis direction or the Y-axis direction. For example, a red light element 1011, a green light element 1012, and a blue light element 1013 may, for example, be disposed on a left side, at the center, and on a right side of one pixel with respect to the XY plane. However, without being limited thereto, the red light element 1011, the green light element 1012, or the blue light element 1013 may be disposed in various sequences on a left side, at the center, and on a right side of one pixel. Furthermore, the red light element 1011, the green light element 1012, or the blue light element 1013 may be disposed on an upper side, at the center, and on a lower side of one pixel.

Figure 12:
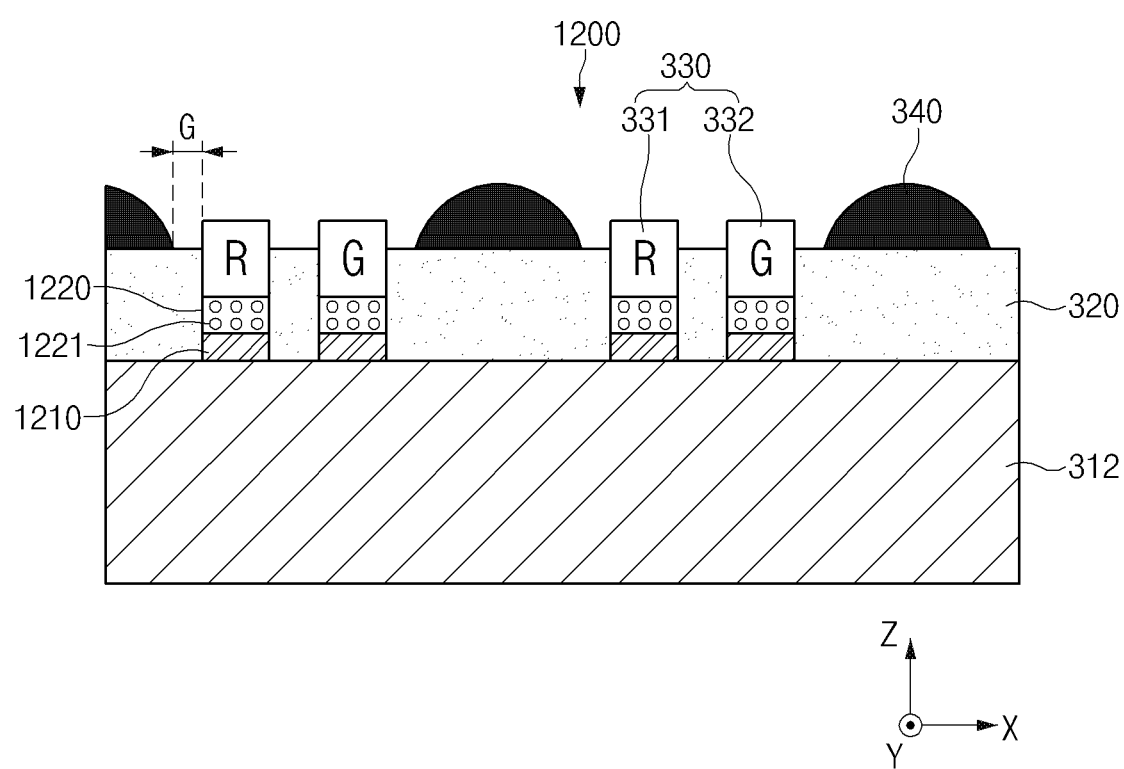
FIG. 12 is a sectional view illustrating an example display module according to an embodiment.

FIG. 12 is a sectional view illustrating an example display module 1200 according to an embodiment. The display module 1200 may include a TFT substrate 312, a connecting member (e.g., including a conductive material) 320, a plurality of inorganic light emitting elements (e.g., including light emitting circuitry, for example, a light emitting diode) 330, a light blocking member (e.g., including an opaque material) 340, at least one interconnection wire 1210, a fixing member 1220, and a plurality of conductive balls 1221. The TFT substrate 312, the plurality of inorganic light emitting elements 330, and the light blocking member 340 of FIG. 12 may be components substantially identical to the TFT substrate 312, the plurality of inorganic light emitting elements 330, and the light blocking member 340 described above in relation to FIG. 3.

In an embodiment, the plurality of inorganic light emitting elements 330 and the light blocking member 340 are spaced apart in the X-axis direction. The plurality of inorganic light emitting elements 330 and the light blocking member 340 do not contact to each other. The gap G is the distance between the plurality of inorganic light emitting elements 330 and the light blocking member 340 in the X-axis direction. The gap G prevents or avoids light blocking member 340 blocking emitted light from the plurality of inorganic light emitting elements 330. The distance of gap G is above 1 μm.

In an embodiment, the connecting member 320 may be an ACF that includes the fixing member 1220 for fixing the plurality of inorganic light emitting elements 330 and the plurality of conductive balls 1221 for electrically connecting the at least one interconnection wire 1210 and the plurality of inorganic light emitting elements 330. The fixing member 1220 may be the modified ACF which is at the state having supporting strength by adding pressure and/or heat to ACF. The material that comprises the fixing member 1220 may be various types of resin. For example, the fixing member 1220 may be made of epoxy resin. The ACF may cause the plurality of conductive balls 1221 to be connected or pressed together in a region to which pressure is applied. The ACF may form a current path, through which current flows, in the region to which the pressure is applied.

In an embodiment, the at least one interconnection wire 1210 may be formed on the TFT substrate 312. In an embodiment, the at least one interconnection wire 1210 may be formed on an upper side of the TFT substrate 312. The at least one interconnection wire 1210 may be connected with a plurality of electrodes and/or a plurality of pads included in the TFT substrate 312.

In an embodiment, the plurality of inorganic light emitting elements 330 may be disposed in specified positions by the fixing member 1220.

In an embodiment, the plurality of inorganic light emitting elements 330 may be disposed to pass through portions of the connecting member 320. The regions of the connecting member 320 in which the plurality of inorganic light emitting elements 330 are disposed may be pressed. A current path may be formed in the regions where the plurality of inorganic light emitting elements 330 are disposed. For example, a current path may be formed in the Z-axis direction in the regions where the plurality of inorganic light emitting elements 330 are disposed.

In an embodiment, the plurality of inorganic light emitting elements 330 and the at least one interconnection wire 1210 may be electrically connected using the current path. Accordingly, the plurality of electrodes and/or the plurality of pads included in the TFT substrate 312 and the plurality of inorganic light emitting elements 330 may be electrically connected through the at least one interconnection wire 1210 and the current path. The plurality of inorganic light emitting elements 330 may emit light by current supplied from the TFT substrate 312.

Figure 13A:
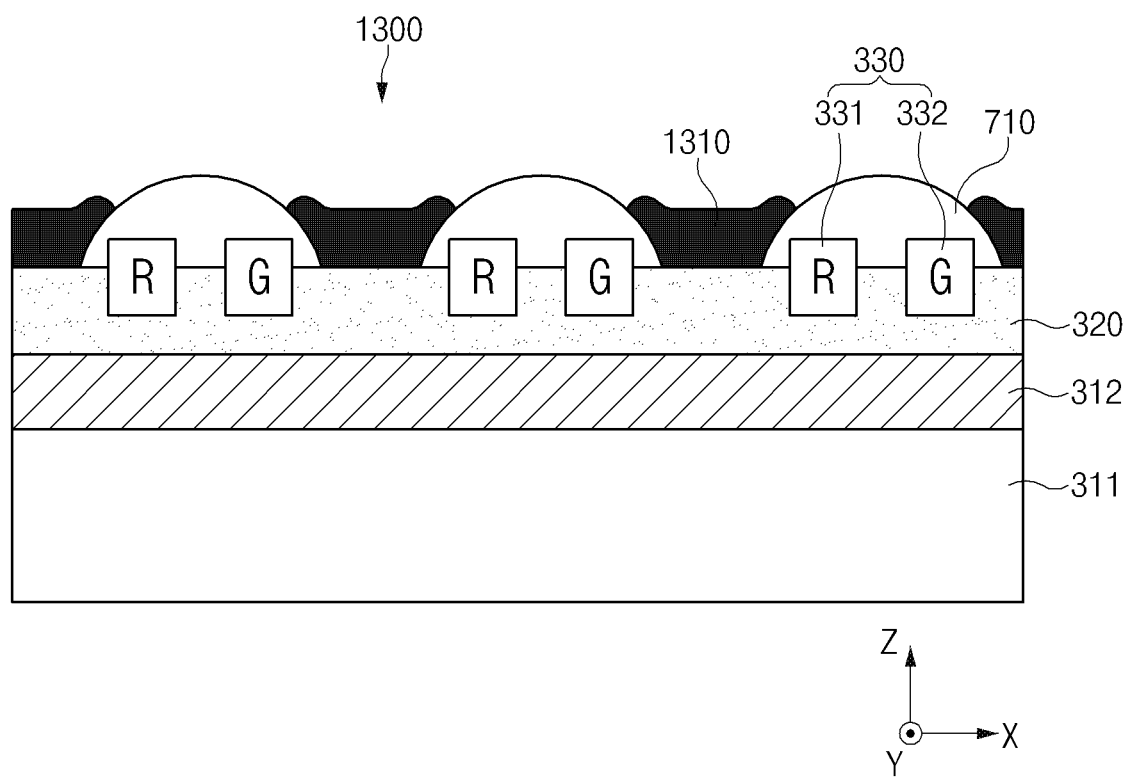
FIGS. 13A and 13B are sectional views illustrating an example display module according to another embodiment.
Figure 13B:
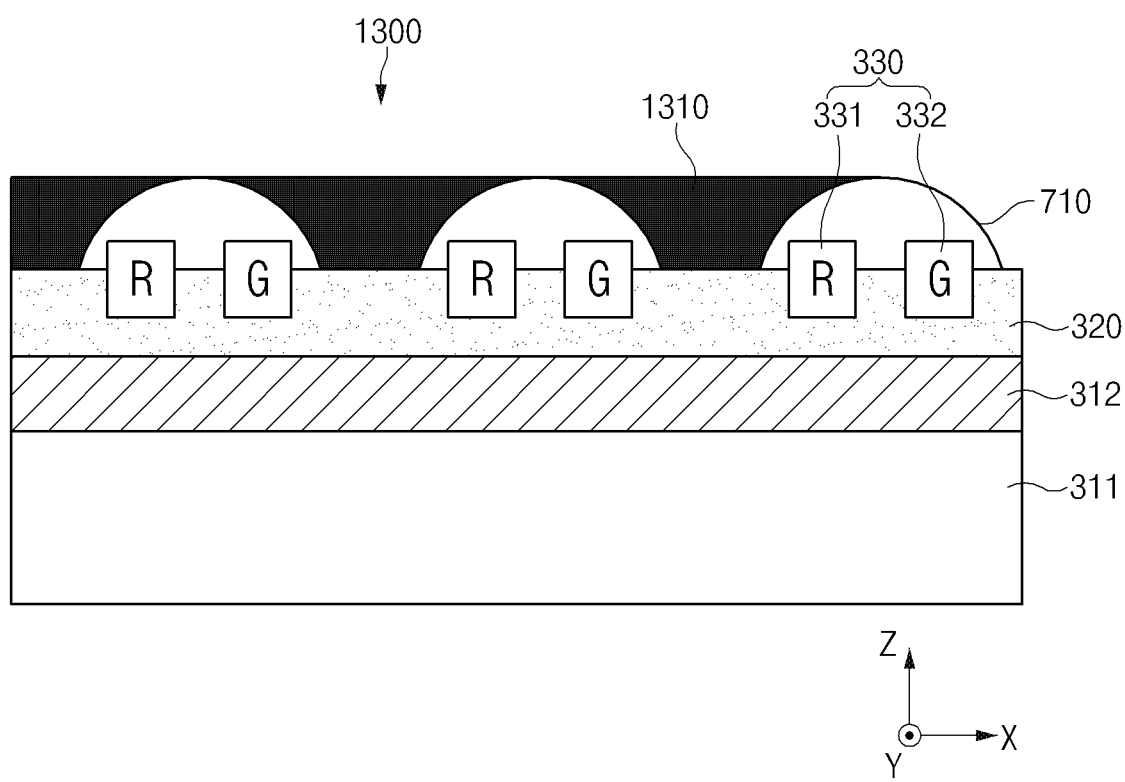

FIGS. 13A and 13B are sectional views illustrating an example display module 1300 according to another embodiment. The display module 1300 may include a support substrate 311, a TFT substrate 312, a connecting member (e.g., including a conductive material) 320, a plurality of inorganic light emitting elements (e.g., including light emitting circuitry, for example, a light emitting diode) 330, a first transparent pattern (e.g., including a transparent material) 710, and a light blocking member (e.g., including an opaque material) 1310. The support substrate 311, the TFT substrate 312, the connecting member 320, and the plurality of inorganic light emitting elements 330 of FIGS. 13A and 13B may be components substantially identical to or similar to the support substrate 311, the TFT substrate 312, the connecting member 320, and the plurality of inorganic light emitting elements 330 described above in relation to FIG. 3. Furthermore, the first transparent pattern 710 of FIGS. 13A and 13B may be a component substantially identical to or similar to the first transparent pattern 710 described above in relation to FIGS. 7A and 7B.

In an embodiment, the light blocking member 1310 may be disposed to make contact with the first transparent pattern 710. The light blocking member 1310 may make contact with a lateral side of the first transparent pattern 710. The light blocking member 1310 may be disposed to overlap the first transparent pattern 710 with respect to the Z-axis direction. The light blocking member 1310 and the first transparent pattern 710 may overlap each other when the degree of repellent liquid characteristic between the first transparent pattern 710 and the light blocking member 1310 is low or the light blocking member 1310 is abundantly applied. The light blocking member 1310 may be spaced apart from the plurality of inorganic light emitting elements 330 by the first transparent pattern 710.

In an embodiment, the light blocking member 1310 may be applied to a portion that is defined as the boundary of the first transparent pattern 710. In the case where the light blocking member 1310 is applied to the portion that is defined as the boundary of the first transparent pattern 710, the aperture ratio of the display module 1300 may be decreased. The CR may be increased in the case of decreasing the aperture ratio of the display module 1300.

In an embodiment, the light blocking member 1310 may be applied after the first transparent pattern 710 is applied by, for example, a jetting method, but the disclosure is not limited thereto. The light blocking member 1310 may, for example, be applied by a jetting method, a spray method, or the like, but is not limited thereto. When the light blocking member 1310 is applied, the first transparent pattern 710 may have a shape to protect the plurality of inorganic light emitting elements 330 such that the light blocking member 1310 does not make contact with the plurality of inorganic light emitting elements 330. The light blocking member 1310, when applied, does not need to be jetted in a pattern form. The light blocking member 1310 may be more easily applied by a spray method, and the tact time of the display module 1300 may be reduced.

In an embodiment, the thickness of the light blocking member 1310 on an upper side may be much smaller than that of the light blocking member 1310 on a lateral side. The light blocking member 1310, before cured, may flow down to a height lower than the height of the first transparent pattern 710 with respect to the Z-axis direction. As illustrated in FIG. 13A, the light blocking member 1310 may at least partly protrude from the border between the light blocking member 1310 and the first transparent pattern 710. However, the light blocking member 1310 is not disposed on an upper portion of the first transparent pattern 710, and therefore the viewing angle of the display module 1300 may be ensured.

In an embodiment, as illustrated in FIG. 13B, the light blocking member 1310 may cover at least part of the upper portion of the first transparent pattern 710. The upper portion of the first transparent pattern 710 may have a convex form, and therefore the light blocking member 1310 may easily flow down to the edge. Accordingly, the light blocking member 130 may be formed to be very thin on the upper portion of the first transparent pattern 710. Furthermore, after the first transparent pattern 710 is formed, a solvent used to form the first transparent pattern 710 may evaporate. A thin film may be formed on an upper side of the first transparent pattern 710 when the solvent evaporates. The thin film may cause the light blocking member 1310 to flow down. Accordingly, the light blocking member 1310 may not hide light emitted from the plurality of inorganic light emitting elements 330 even though a structure close to wetting in which the light blocking member 1310 is formed to an emissive area is formed.

In an embodiment, the first transparent pattern 710 may be applied to be wider than the emissive area. The light blocking member 1310 may be formed to be thick on the lateral side of the first transparent pattern 710, and thus a high CR may be maintained when the plurality of inorganic light emitting elements 330 are turned on. Furthermore, most of light may pass because most of the light blocking member 1310 substantially flows down from the upper side of the first transparent pattern 710 and the remaining light blocking member 1310 is a very thin film. Accordingly, the viewing angle of the display module 1300 may be ensured.

Figure 14:
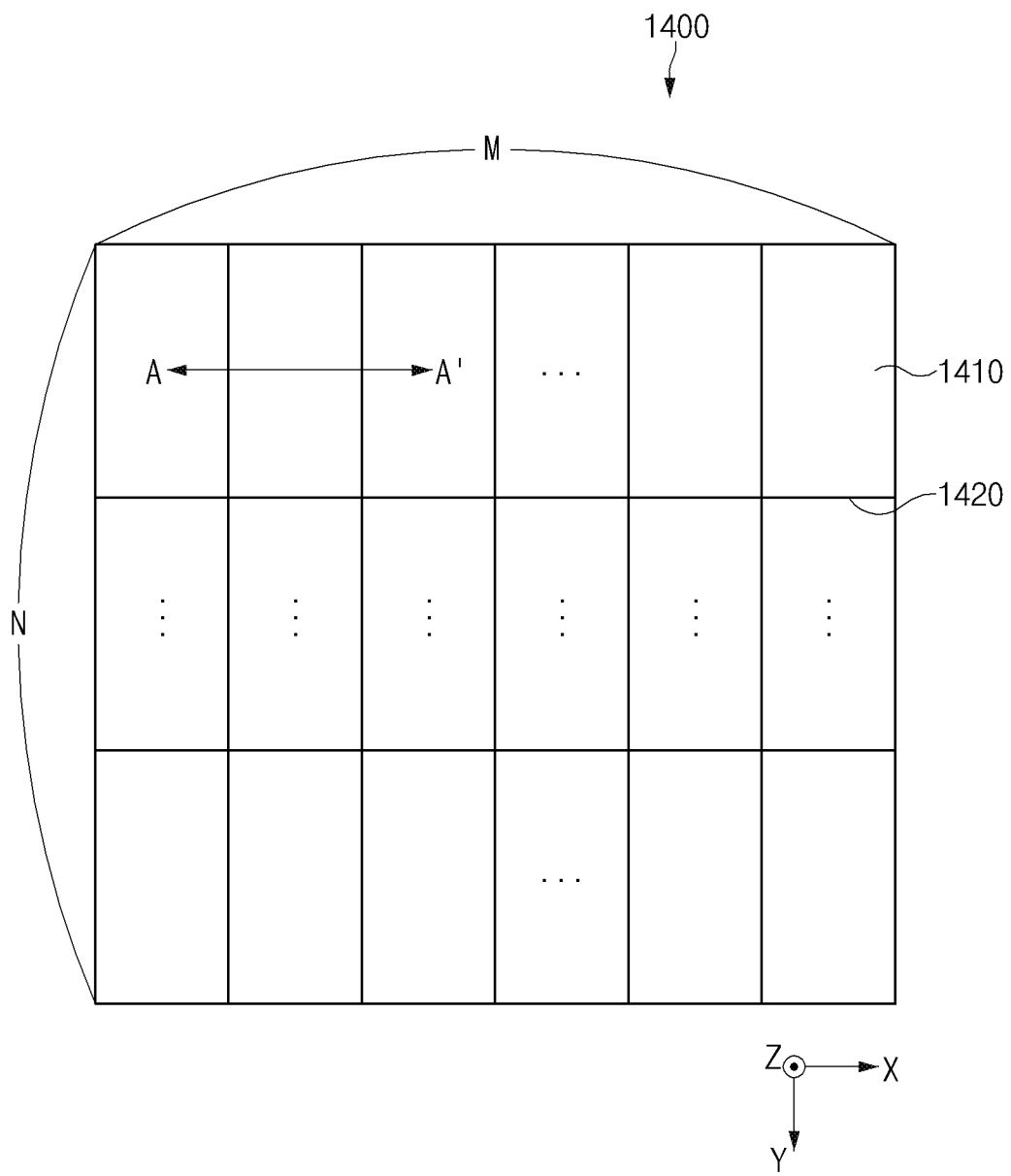
FIG. 14 is a front view illustrating an example display device according to an embodiment.

FIG. 14 is a front view illustrating an example display device 1400 according to an embodiment.

In an embodiment, the display device 1400 may include one or more display modules 1410 and a connecting portion (e.g., a region between adjacent display modules) 1420.

In an embodiment, the display modules 1410 may include a substrate 310, a connecting member 320, a plurality of inorganic light emitting elements 330, and a light blocking member 340. The display modules 1410 may display a screen based on image data. The connecting portion 1420 may be formed in the display device 1400 having a large display that cannot be formed by one display module 1410.

In an embodiment, the connecting portion 1420 may connect the one or more display modules 1410. The display modules 1410 connected by the connecting portion 1420 may display one screen. The connecting portion 1420 may include, on a lateral side thereof, a connecting member for connecting the one or more display modules 1410 or a side coating member for preventing and/or reducing a gap between the display modules 1410, which is formed in the connecting portion 1420, from being viewed from the outside.

Figure 15A:
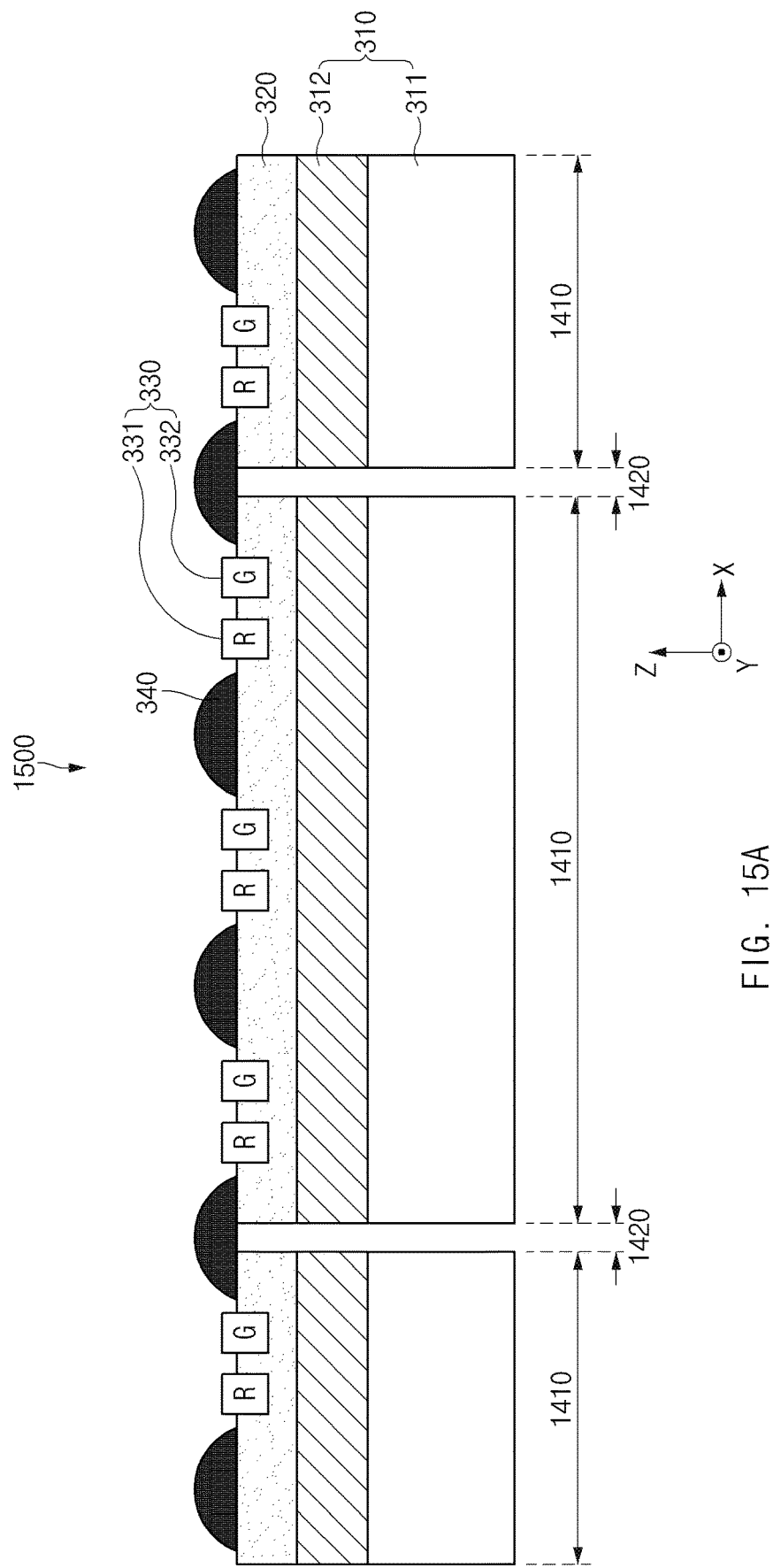
FIGS. 15A and 15B are sectional views illustrating an example display device according to an embodiment.
Figure 15B:
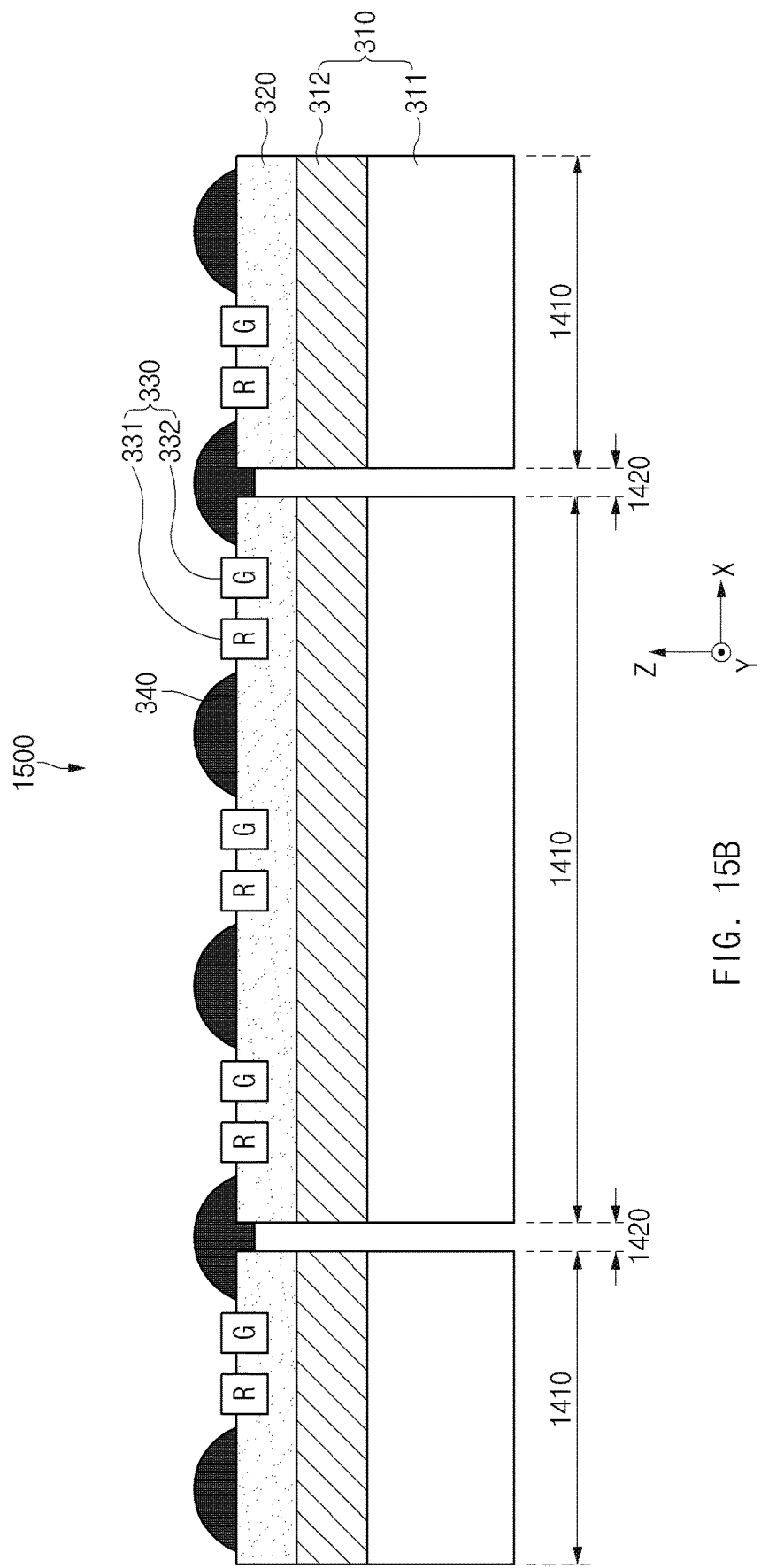

FIGS. 15A and 15B are sectional views illustrating an example display device 1500 according to an embodiment. The display device 1500 may include a substrate 310, a connecting member (e.g., including a conductive material) 320, a plurality of inorganic light emitting elements (e.g., including light emitting circuitry, for example, a light emitting diode) 330, and a light blocking member (e.g., including an opaque material) 340. The substrate 310, the connecting member 320, the plurality of inorganic light emitting elements 330, and the light blocking member 340 of FIGS. 15A and 15B may be components substantially identical to or similar to the substrate 310, the connecting member 320, the plurality of inorganic light emitting elements 330, and the light blocking member 340 described above in relation to FIG. 3.

In an embodiment, the light blocking member 340 may be spaced apart from the substrate 310 and disposed on a connecting portion (or region) 1420 and the connecting member 320. The connecting portion 1420 may be formed in a structure in which a hole is between display modules 1410. The connecting portion 1420 may be visible from the front of the display device 1500 in the case where light emitted from the plurality of inorganic light emitting elements 330 leaks from lateral sides of the display modules 1410 or external light is reflected from the lateral sides of the display modules 1410. In the case of disposing the light blocking member 340 on the connecting portion 1420, the connecting portion 1420 may be prevented from being viewed.

In an embodiment, the light blocking member 340 may be disposed on the connecting portion 1420. For example, as illustrated in FIG. 15A, due to the viscosity and curing of the light blocking member 340, the light blocking member 340 may be disposed on the connecting member 320 without flowing down to the connecting portion 1420. In another example, as illustrated in FIG. 15B, the light blocking member 340 may be disposed in the state of at least partly flowing into the connecting portion 1420. The connecting portion 1420 may have a width of about 100 μm or less in the X-axis direction. Accordingly, the amount of the light blocking member 340 flowing into the connecting portion 1420 is small, and a specified penetration condition range may be satisfied.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to the embodiments of the disclosure, the light blocking member may be formed on the upper side of the connecting member, thereby improving the contrast ratio of the display module and enabling representation of a darker black gradation, irrespective of non-uniformity of the color or surface of the connecting member.

Furthermore, according to various example embodiments of the disclosure, the light blocking member is disposed on a region other that the regions where the plurality of inorganic light emitting elements are disposed, thereby implementing a display module having μLEDs applied thereto that has a light blocking member that does not reduce a viewing angle and that does not invade emissive areas of inorganic light emitting elements.

In addition, the disclosure may provide various effects that are directly or indirectly recognized.

While the disclosure has been illustrated and described with reference to various example embodiments thereof, it will be understood by those skilled in the art that various changes in form and details may be made therein without departing from the spirit and scope of the disclosure as defined, for example, by the appended claims and their equivalents.

What is claimed is:

1. A display module comprising:
a substrate including a plurality of interconnection wires;
a connecting member comprising a conductive material disposed on one side of the substrate;
a plurality of inorganic light emitting elements comprising light emitting circuitry arranged on the connecting member; and
a light blocking member comprising an opaque material disposed on a region of the connecting member other than regions where the plurality of inorganic light emitting elements are disposed and disposed at least partially between lateral sides facing each other of the plurality of inorganic light emitting elements,
wherein a portion of each of the plurality of inorganic light emitting elements is disposed to pass through a portion of the connecting member and is spaced apart from the substrate, and a portion of each of the plurality of inorganic light emitting elements extends above a top surface of the connecting member,
wherein the connecting member electrically connects each of the plurality of inorganic light emitting elements with at least one interconnection wire among the plurality of interconnection wires, and
wherein the light blocking member is spaced apart laterally from the plurality of inorganic light emitting elements so that a gap is provided between at least the light blocking member and the plurality of inorganic light emitting elements when viewed from above the display module.

2. The display module of claim 1, wherein at least a portion of the light blocking member is disposed directly on the region of the connecting member other than the regions where the plurality of inorganic light emitting elements are disposed.

3. The display module of claim 1, further comprising:
a transparent layer disposed on the plurality of inorganic light emitting elements and the light blocking member.

4. The display module of claim 1, further comprising:
a transparent layer disposed on the connecting member and the plurality of inorganic light emitting elements,
wherein the light blocking member is disposed on the transparent layer.

5. The display module of claim 1, further comprising:
a first transparent pattern comprising a transparent material disposed on the plurality of inorganic light emitting elements,
wherein the light blocking member is disposed on a region other than where the first transparent pattern is disposed.

6. The display module of claim 5, further comprising:
a second transparent pattern comprising transparent material disposed on the light blocking member and the first transparent pattern.

7. The display module of claim 1, wherein the connecting member includes:
a fixing member configured to fix the plurality of inorganic light emitting elements; and
a plurality of conductive balls configured to electrically connect the at least one interconnection wire and the plurality of inorganic light emitting elements.

8. The display module of claim 1, further comprising:
a first transparent pattern comprising a transparent material disposed on the plurality of inorganic light emitting elements,
wherein the light blocking member is disposed to make contact with the first transparent pattern.

9. A display device comprising:

a plurality of display modules; and a connecting portion including a connecting region configured to connect the plurality of display modules, wherein each of the one or more plurality of display modules includes:

a substrate including a plurality of interconnection wires;

a connecting member comprising a conductive material disposed on one side of the substrate;

a plurality of inorganic light emitting elements comprising light emitting circuitry arranged on the connecting member; and a light blocking member comprising an opaque material disposed on a region of the connecting member other than regions where the plurality of inorganic light emitting elements are disposed, wherein a portion of each of the plurality of inorganic light emitting elements is disposed to pass through a portion of the connecting member and is spaced apart from the substrate, wherein the connecting member electrically connects each of the plurality of inorganic light emitting elements with at least one interconnection wire among the plurality of interconnection wires, and wherein the light blocking member is spaced apart from the substrate and disposed on the connecting portion and the connecting member.

10. The display device of claim 9, wherein the light blocking member is spaced apart from the plurality of inorganic light emitting elements.

11. The display device of claim 9, further comprising:

a transparent layer disposed on the plurality of inorganic light emitting elements and the light blocking member.

12. The display device of claim 9, further comprising:

a transparent layer disposed on the connecting member and the plurality of inorganic light emitting elements, wherein the light blocking member is disposed on the transparent layer.

13. The display device of claim 9, further comprising:

a first transparent pattern comprising a transparent material disposed on the plurality of inorganic light emitting elements, wherein the light blocking member is spaced apart from the first transparent pattern.

14. The display device of claim 13, further comprising:

a second transparent pattern comprising a transparent material disposed on the light blocking member and the first transparent pattern.

15. The display device of claim 9, wherein the connecting member includes:

a fixing member configured to fix the plurality of inorganic light emitting elements; and a plurality of conductive balls configured to electrically connect the at least one interconnection wire and the plurality of inorganic light emitting elements.

16. A display module comprising:

a substrate;

a connecting member comprising a conductive material disposed on an upper side of the substrate;

a plurality of inorganic light emitting elements comprising light emitting circuitry, each of the plurality of inorganic light emitting elements disposed to pass through at least a portion of the connecting member and is fixed in a specified position and a portion of each of the plurality of inorganic light emitting elements extends above a top surface of the connecting member; and a black matrix (BM) comprising an opaque material spaced apart from the plurality of inorganic light emitting elements and disposed at least partially between lateral sides facing each other of the plurality of inorganic light emitting elements, wherein the plurality of inorganic light emitting elements are spaced apart from the substrate, wherein the connecting member electrically connects the plurality of inorganic light emitting elements with a plurality of electrodes or a plurality of pads disposed on the substrate, and wherein the BM is spaced apart laterally from the inorganic light emitting elements so that gap is provided between the light blocking member and the plurality of inorganic light emitting elements when viewed from above the display module.

17. The display module of claim 16, further comprising:

a transparent layer disposed on the plurality of inorganic light emitting elements and the BM.

18. The display module of claim 16, further comprising:

a transparent layer disposed on the connecting member and the plurality of inorganic light emitting elements, wherein the BM is disposed on the transparent layer.

19. The display module of claim 16, further comprising:

a first transparent pattern comprising a transparent material disposed on the plurality of inorganic light emitting elements, wherein the BM and the first transparent pattern have a repellent liquid characteristic therebetween.

20. The display module of claim 19, further comprising:

a second transparent pattern comprising a transparent material configured to substantially uniformly cover an upper side of the BM and an upper side of the first transparent pattern.

* * * * *